US012740148B2

(12) United States Patent
Jin

(10) Patent No.: US 12,740,148 B2
(45) Date of Patent: Sep. 15, 2026

(54) DISPLAY DEVICE AND MANUFACTURING METHOD THEREOF

(71) Applicant: Samsung Display Co., LTD., Yongin-si (KR)

(72) Inventor: Ki Su Jin, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 272 days.

(21) Appl. No.: 18/415,461

(22) Filed: Jan. 17, 2024

(65) Prior Publication Data

US 2024/0405029 A1 Dec. 5, 2024

(30) Foreign Application Priority Data

May 31, 2023 (KR) ........................ 10-2023-0070034

(51) Int. Cl.

| | |
|---|---|
| ***H10D 86/60*** | (2025.01) |
| ***H10D 86/40*** | (2025.01) |
| ***H10H 20/01*** | (2025.01) |
| ***H10H 20/857*** | (2025.01) |
| ***H10W 90/00*** | (2026.01) |

(52) U.S. Cl.

CPC ........... *H10D 86/60* (2025.01); *H10D 86/443* (2025.01); *H10H 20/857* (2025.01); *H10W 90/00* (2026.01); *H10H 20/0364* (2025.01)

(58) Field of Classification Search

CPC ..... H10D 86/443; H10D 86/60; H10H 20/857

See application file for complete search history.

(56) References Cited

U.S. PATENT DOCUMENTS

2019/0197286 A1* 6/2019 Kim .................. G06V 40/1318
2020/0013803 A1* 1/2020 Jang .................... H10D 86/441
2020/0135126 A1* 4/2020 Yokoyama .......... G09G 3/3648
2020/0203235 A1 6/2020 Jung et al.
2022/0068972 A1 3/2022 Gong et al.
2022/0139962 A1* 5/2022 Jeong .................. H10D 86/441 257/88
2022/0277659 A1 9/2022 Bramlet et al.
2022/0277689 A1* 9/2022 Zhao ....................... G09G 3/32

(Continued)

FOREIGN PATENT DOCUMENTS

GB 2609142 A 1/2023
KR 10-2021-0135385 A 11/2021

(Continued)

*Primary Examiner* — Evren Seven

(74) *Attorney, Agent, or Firm* — Womble Bond Dickinson (US) LLP

(57) ABSTRACT

A display device includes a substrate having first and second surfaces, transistors, data lines, and light-emitting diodes above the first surface, front data pads above the first surface, electrically connected to the data lines, and arranged in a first direction along a first side of the substrate, a first insulating layer above the front data pads, rear data pads under the second surface, and arranged in the first direction, a second insulating layer under the rear data pads, and defining first and second openings overlapping one of the rear data pads, a first virtual line extending from the first opening in the first direction not overlapping the second opening, and a side wire connecting a front data pad to a rear data pad, and electrically connected to and overlapping the first rear data pad through the first opening.

19 Claims, 17 Drawing Sheets

(56) References Cited

U.S. PATENT DOCUMENTS

2023/0005962 A1 1/2023 Lee et al.
2023/0206788 A1* 6/2023 Yang .................... G09F 9/3026
257/79
2023/0238495 A1 7/2023 Choi et al.
2024/0266364 A1* 8/2024 Park .................... H10D 86/451

FOREIGN PATENT DOCUMENTS

KR 10-2022-0062445 A 5/2022
KR 10-2022-0077324 A 6/2022
KR 10-2023-0115183 A 8/2023

* cited by examiner

DISPLAY DEVICE AND MANUFACTURING METHOD THEREOF

CROSS-REFERENCE TO RELATED APPLICATION

The present application claims priority to, and the benefit of, Korean Patent Application No. 10-2023-0070034, filed on May 31, 2023, in the Korean Intellectual Property Office, the entire disclosure of which is incorporated herein by reference.

BACKGROUND

1. Field

The present disclosure relates to a display device and a manufacturing method thereof.

2. Description of the Related Art

The display device includes a plurality of pixels that are units for displaying an image.

Among various display devices, each pixel of the display device includes a cathode, an anode, and a light-emitting unit, and a plurality of transistors and at least one capacitor for driving a light-emitting diode.

The pixel circuit is connected to various signal lines and voltage lines, such as a plurality of data lines and driving voltage lines.

The plurality of transistors may include at least one switching transistor and/or a driving transistor.

The switching transistor receives a data signal according to the scan signal, and transfers the corresponding voltage to the driving transistor. The driving transistor is directly or indirectly connected to the light-emitting diode to control the amount of driving current delivered to the light-emitting diode, allowing each pixel to emit light of the desired brightness.

The light-emitting diode may be mounted on a display panel in which transistors are formed in a chip form.

Meanwhile, a large screen can be realized through a tiled display device in which a plurality of display devices are connected to each other.

In the case of a tiled display device, the quality of an image can be improved as the area between neighboring display devices becomes smaller.

SUMMARY

A data pad of a data signal line for transmitting a data signal to a pixel circuit may be positioned in a peripheral area on the front surface of each display device, and data pads positioned on the front of the display device may be connected to data pads on the rear surface of the display device through side wires to receive data signals.

Embodiments of the present disclosure improve a short-circuit occurrence defect between adjacent data pads due to side wires.

A display device according to one or more embodiments includes a substrate having opposite first and second surfaces, and including a display area, and a peripheral area around the display area in plan view, transistors above the first surface of the substrate, data lines above the first surface of the substrate, and electrically connected to the transistors, light-emitting diodes above the first surface of the substrate, front data pads above the first surface of the substrate, electrically connected to the data lines, and arranged in a first direction along a first side of the substrate, a first insulating layer above the front data pads, rear data pads under the second surface of the substrate, and arranged in the first direction, a second insulating layer under the rear data pads, and defining a first opening and a second opening overlapping one of the rear data pads, a first virtual line extending from the first opening in the first direction not overlapping the second opening, and a first side wire electrically connecting a first front data pad of the front data pads to a first rear data pad of the rear data pads, and electrically connected to and overlapping the first rear data pad through the first opening.

A first horizontal side of the first opening, which extends in the first direction and is closer to the display area than a second horizontal side of the first opening, may be closer to the first side of the substrate than a third horizontal side of the second opening, which extends in the first direction and is farther from the display area than a fourth horizontal side of the second opening.

The first opening may correspond to a first side of the first rear data pad with respect to the first direction, wherein the second opening corresponds to a second side of the first rear data pad that is opposite to the first side of the first rear data pad.

A second virtual line extending from the first opening in a second direction crossing the first direction might not overlap the second opening.

The first opening may be at a first corner of the one of the rear data pads, wherein the second opening is at a second corner of the one of the rear data pads that is diagonal to the first corner.

The display device may further include a second side wire that electrically connects a second front data pad of the front data pads to a second rear data pad of the rear data pads, wherein the second insulating layer defines a third opening and a fourth opening overlapping the second rear data pad, wherein the second side wire is electrically connected to and overlaps the second rear data pad through the third opening, and wherein a third virtual line extending from the third opening in the first direction does not overlap the fourth opening.

The display device may further include a residue connected to the second side wire, including a same material as the second side wire, and at a same layer.

A width of the residue in a second direction crossing the first direction may be less than or equal to a width of the second side wire in the second direction.

The residue may protrude toward the first rear data pad that is adjacent to the second rear data pad.

The residue may overlap the first rear data pad, and might not overlap the second opening.

The display device may further include an anode pad and a cathode pad at a same layer as the front data pads, above the first surface of the substrate at the display area, and electrically connected to one of the light-emitting diodes.

The first insulating layer may define a fifth opening overlapping the anode pad, and a sixth opening overlapping the cathode pad.

The display device may further include a printed circuit board including a driving circuit under the second surface of the substrate.

A display device according to one or more embodiments includes a substrate having opposite first and second surfaces, and including a display area, and a peripheral area around the display area in plan view, transistors above the first surface of the substrate, data lines above the first surface of the substrate, and electrically connected to the transistors, light-emitting diodes above the first surface of the substrate, a front data pad above the first surface of the substrate, electrically connected to the data lines, and arranged in a first direction along a first side of the substrate, a first insulating layer on the front data pads, a rear data pad under the second surface of the substrate, and arranged in the first direction, a second insulating layer under the rear data pads, and defining a first opening and a second opening overlapping the rear data pads, and a side wire electrically connecting the front data pad and the rear data pad, electrically connected to and overlapping the rear data pad through the first opening, and including a residue at a same layer as, and including a same material as, the side wire.

A width of the residue in a second direction crossing the first direction may be less than or equal to a width of the side wire in the second direction.

The residue may protrude toward another rear data pad adjacent to the side wire.

The residue might not overlap the other rear data pad.

The method of manufacturing a display device according to one or more embodiments includes forming front data pads on a first surface of a substrate, forming a first insulating layer above the front data pads, and defining a first opening overlapping one of the front data pads, forming rear data pads on a second surface of the substrate that is opposite the first surface, forming a second insulating layer under the rear data pads, and defining a second opening and a third opening overlapping one of the rear data pads, forming a passivation layer above the second insulating layer, covering the third opening, and defining a fourth opening overlapping the second opening, forming side wires electrically connecting the front data pads and the rear data pads respectively corresponding to each other, and removing the passivation layer.

The forming of the passivation layer may include coating an organic material on the second insulating layer, and curing the organic material layer.

The forming of the side wires may include transferring a conductive material layer including silver (Ag) to a side surface, a front surface, and a rear surface of the display device through a printing pad.

According to one or more embodiments, a tiled display device includes display devices, an adhesive layer between adjacent ones of the display devices, and a driving circuit unit on a rear surface of at least one of the display devices, wherein the display devices include a substrate having opposite first and second surfaces, and including a display area, and a peripheral area around the display area in plan view, and, transistors above the first surface of the substrate, data lines above the first surface of the substrate, and electrically connected to the transistors, light-emitting diodes above the first surface of the substrate, front data pads above the first surface of the substrate, electrically connected to the data lines, and arranged in a first direction along a first side of the substrate, a first insulating layer above the front data pads, rear data pads under the second surface of the substrate, and arranged in the first direction, a second insulating layer under the rear data pads, and defining a first opening and a second opening overlapping one of the rear data pads, a virtual line extending in the first direction from the first opening not overlapping the second opening, and a first side wire electrically connecting a first front data pad of the front data pads to a first rear data pad of the rear data pads, and electrically connected to and overlapping the first rear data pad through the first opening.

A first horizontal side of the first opening extending in the first direction, which is closer to the display area than second horizontal side of the first opening extending in the first direction, may be closer to the first side of the substrate than a third horizontal side of the second opening that is farther from the display area than the first horizontal side.

According to the embodiments, a short-circuit failure between adjacent data pads due to side wires may be ameliorated.

BRIEF DESCRIPTION OF DRAWINGS

FIG. 2 is a rear plan view of a display device according to one or more embodiments, FIG. 6 is a drawing illustrating a process of forming side wires of a display device according to one or more embodiments, FIG. 8 is a plan view of a part of a rear surface of a display device according to one or more embodiments, FIG. 9 is a plan view of a portion of a rear surface of a display device according to one or more embodiments.

DETAILED DESCRIPTION

Figure 1:
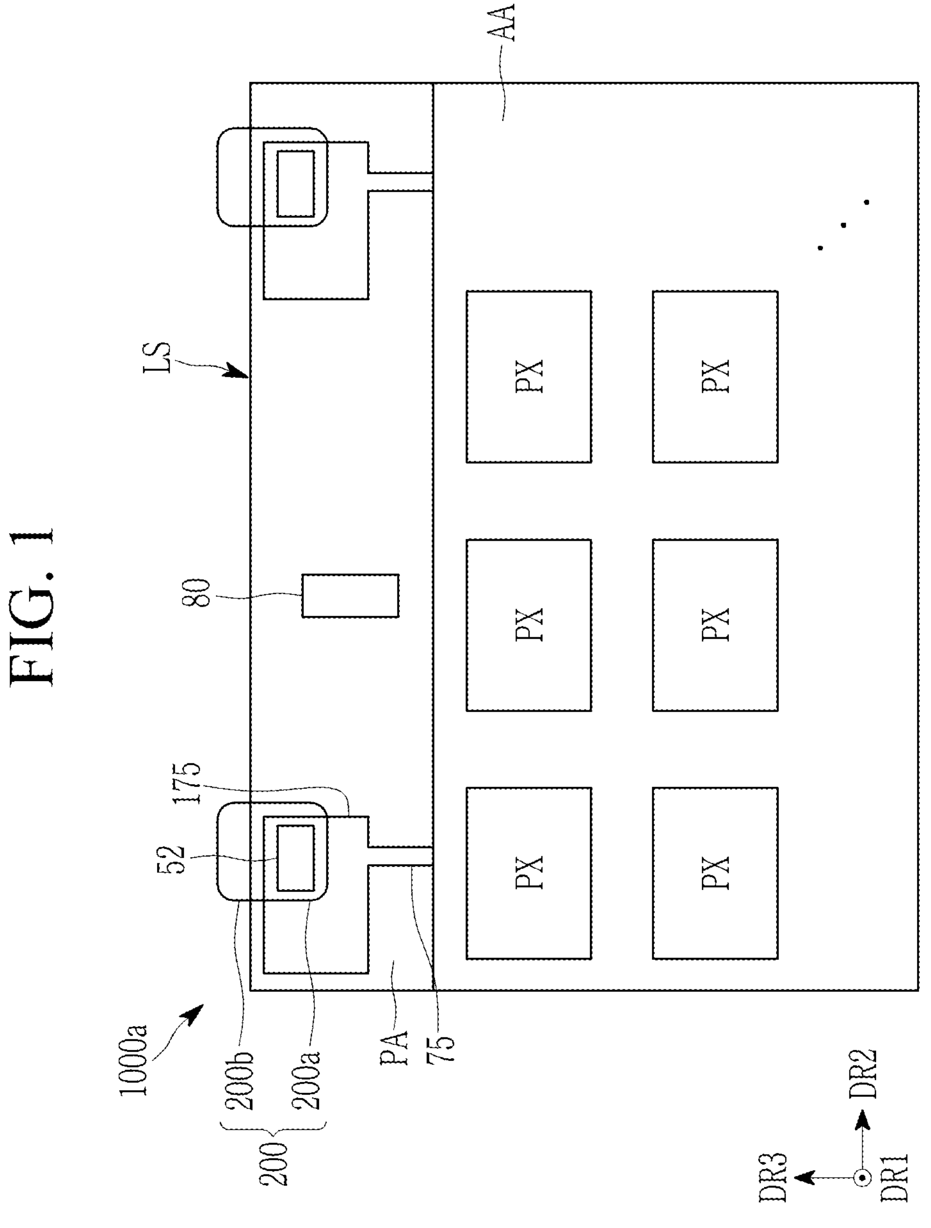
FIG. 1 is a front plan view of a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. It will be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to one or more embodiments will be described with reference to FIG. 1 and FIG. 2.

Figure 2:
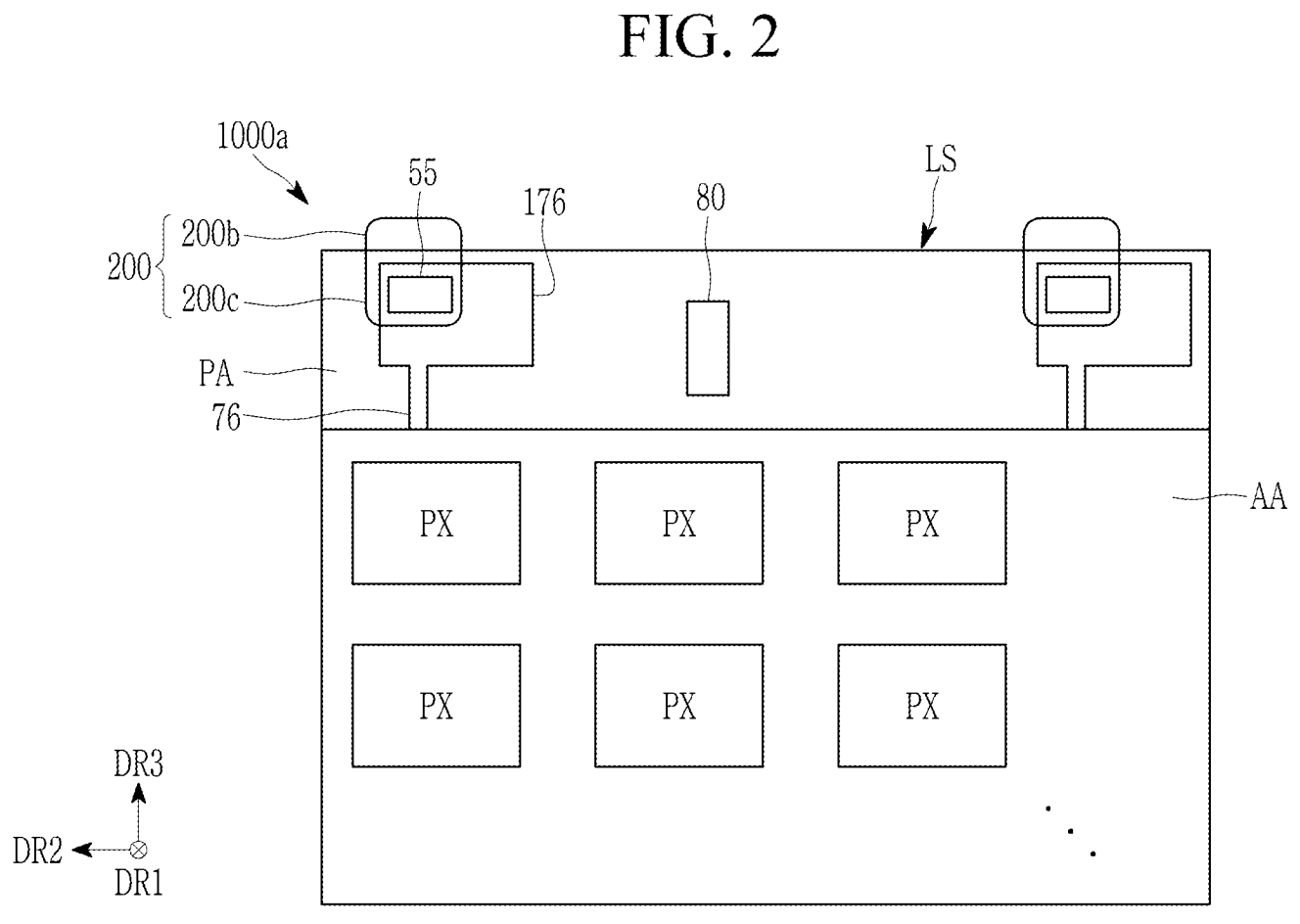

FIG. 1 is a front plan view of a display device according to one or more embodiments, and FIG. 2 is a rear plan view of the display device according to one or more embodiments.

Referring to FIG. 1 and FIG. 2, a display device 1000*a* according to one or more embodiments may include a display area AA capable of displaying an image, and a peripheral area PA positioned around the display area AA (e.g., in plan view).

The display area AA includes a plurality of pixels PX arranged on a plane parallel to the second and third directions DR2 and DR3, which are perpendicular to the first direction DR1, the plane being connected to the pixels PX, and including a plurality of signal lines and a plurality of voltage lines.

In this description, the direction in which the display device emits light of an image displayed by the pixel PX is defined as the first direction DR1. A surface parallel to the second direction DR2 and the third direction DR3 is referred to as a front surface, and a surface opposite to the front surface is referred to as a rear surface. For example, the side displaying the image based on the substrate included in the display device may be referred to as the front side of the display device, and the opposite side may be referred to as the rear side.

A view looking at the front or back is called a plan view.

The plurality of signal lines may include a plurality of scan lines capable of transmitting scan signals, and a plurality of data lines capable of transmitting data signals.

Each scan line may extend substantially in the second direction DR2 in the display area AA, but it is not limited thereto. A plurality of scan lines may be connected to a scan driver positioned in the peripheral area PA. The scan driver may be positioned in the peripheral area PA on the front side of the display device or on the rear side of the display device.

The data lines may cross the plurality of scan lines in the display area AA, and may extend substantially in the third direction DR3. The data line extending to the peripheral area PA may be electrically connected to the front data pad 175 through the front connection wire 75. The data driver for transmitting the data signals to the data lines may include at least one driving circuit chip, and may be positioned on the rear surface of the display device 1000*a*.

The plurality of voltage lines may include a driving voltage line for transmitting a driving voltage to the pixel PX, a power voltage line for transmitting a power voltage that is different from the driving voltage, and the like.

One pixel PX may include a light-emitting element capable of emitting light in response to one image signal, and a pixel circuit for driving the light-emitting element. The pixel circuit may include at least one transistor and/or a pixel electrode connected thereto.

The plurality of pixels PX are capable of emitting light of different colors. For example, the plurality of pixels PX may include a red pixel capable of emitting red light, a green pixel capable of emitting green light, and a blue pixel capable of emitting blue light. However, the color of light emitted by the pixel PX is not limited thereto and may vary. In a plan view, the plurality of pixels PX may be arranged in various structures, such as a rectangular matrix shape or a PENTILE™ matrix shape (e.g., a RGBG matrix structure, a PENTILE™ matrix structure, a PENTILE™ structure, or an RGBG structure, PENTILE™ being a registered trademark of Samsung Display Co., Ltd., Republic of Korea).

A plurality of conductive front data pads 175, and front connection wires 75 connected thereto, are positioned in the peripheral area PA on the front surface of the display device 1000*a*. A plurality of conductive rear data pads 176, and a rear connection wire 76 connected thereto, may be positioned in the peripheral area PA on the rear surface of the display device 1000*a*.

The front data pad 175 may be extended compared to the front connection wire 75 or the data line, and the rear data pad 176 may be extended compared to the rear connection wire 76 or the data line.

The width of the front data pad 175 in the second direction DR2 may be greater than the width of the front connection wire 75 in the second direction DR2. The width of the rear data pad 176 in the second direction DR2 may be greater than that of the rear connection wire 76 in the second direction DR2.

An insulating layer is positioned on the front data pad 175, and the insulating layer has (e.g., defines) an opening 52 overlapping the front data pad 175 in a plan view. A width of the opening 52 in the second direction DR2 may be less than a width of the front data pad 175 in the second direction DR2. For example, the width of the opening 52 in the second direction DR2 may be less than or equal to about half of the width of the front data pad 175 in the second direction DR2.

The opening 52 may be positioned on one side of the area of the front data pad 175 with respect to the second direction DR2. For example, as shown in FIG. 1, the opening 52 overlapping the front data pad 175 may be positioned on the right side of the area of the front data pad 175 (e.g., in plan view).

However, the present disclosure is not limited thereto, and the opening 52 overlapping the front data pad 175 may be positioned anywhere from the center to the left side of the area of the front data pad 175.

An insulating layer is positioned on the rear data pad 176, and the insulating layer has (e.g., defines) an opening 55 overlapping the rear data pad 176 in a plan view. A width of the opening 55 in the second direction DR2 may be less than a width of the rear data pad 176 in the second direction DR2. For example, the width of the opening 55 in the second direction DR2 may be less than or equal to about half of the width of the rear data pad 176 in the second direction DR2.

The opening 55 may be positioned on one side of the area of the rear data pad 176 in the second direction DR2. For example, as shown in FIG. 2, the opening 55 overlapping the rear data pad 176 may be positioned on the left side of the area of the rear data pad 176. However, the present disclosure is not limited thereto, and the opening 55 overlapping the rear data pad 176 may be positioned anywhere from the center to the right side of the area of the rear data pad 176.

In one or more embodiments, the opening 52 may be substantially aligned at the center of the front data pad 175 without being biased toward the left or right side.

The front data pads 175 and the rear data pads 176 corresponding to each other may be electrically connected to each other through the conductive side wires 200.

Each side wire 200 may include a front portion 200*a* positioned on the front of the display device 1000*a* and overlapping the front of the display device 1000*a* in a plane, a rear portion 200*c* positioned on the back of the display device 1000*a* and overlapping the back of the display device 1000*a* in a plane, and a side portion 200*b* positioned between the front portion 200*a* and the rear portion 200*c*, connecting the front portion 200*a* and the rear portion 200*c*, and positioned on the side of the display device 1000*a*.

The side portion 200*b* may not overlap the front or rear surface of the display device 1000*a* in a plan view. The front portion 200*a*, the rear portion 200*c*, and the side portion 200*b* may be wires continuously formed as one layer.

The front portion 200*a* of the side wire 200 is electrically connected to the front data pad 175 through the opening 52. The rear portion 200*c* of the side wire 200 is electrically connected to the rear data pad 176 through the opening 55.

Referring to FIG. 1, the width of the front portion 200*a* of the side wire 200 in the second direction DR2 may be less than the width of the front data pad 175 in the second direction DR2.

Referring to FIG. 2, the width of the rear portion 200*c* of the side wire 200 in the second direction DR2 may be less than the width of the rear data pad 176 in the second direction DR2.

In one or more embodiments, the width of the front portion 200*a* of the side wire 200 in the second direction DR2 may be greater than or similar to the width of the front data pad 175 in the second direction DR2.

The side wire 200 may include a metal, such as silver (Ag).

One or more alignment keys 80 for aligning components of the display device, for aligning layers, or for aligning a mask during exposure, may be positioned in the peripheral area PA.

Referring to FIG. 1 and FIG. 2, when the display device 1000*a* has a substantially rectangular shape, a plurality of side wires 200 may be arranged along a long side LS among edge sides. The long side LS of the display device 1000*a* may extend substantially in the second direction DR2. That is, the plurality of side wires 200 may be spaced apart from each other and arranged substantially along the second direction DR2.

A detailed cross-sectional composition of a display device according to one or more embodiments will be described with reference to FIG. 3, along with FIG. 1 and FIG. 2.

Figure 3:
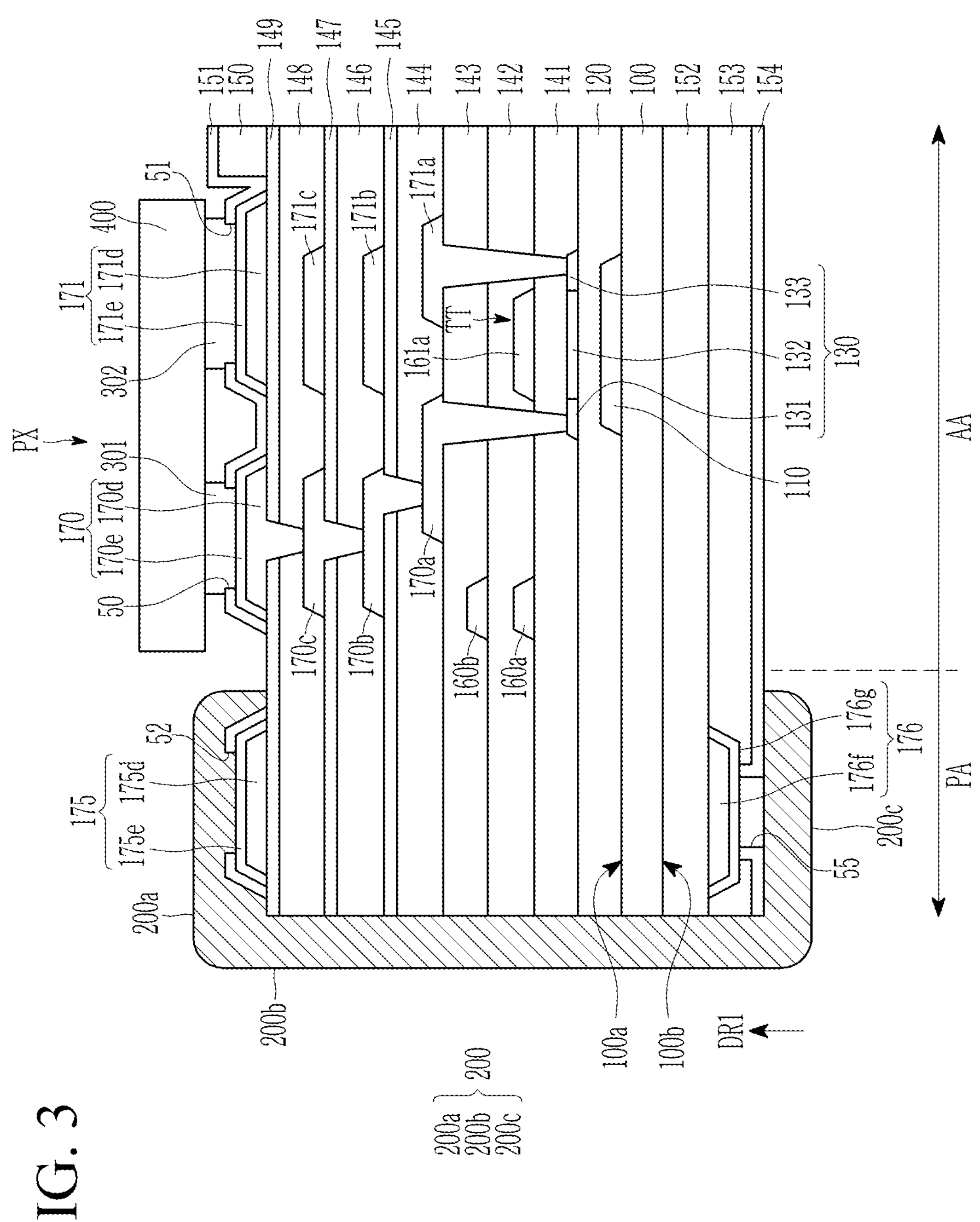
FIG. 3 is a cross-sectional view of a display device according to one or more embodiments.

FIG. 3 is a cross-sectional view of a display device according to one or more embodiments.

Referring to FIG. 3, a display device according to one or more embodiments may include a substrate 100 that may include an inorganic insulating material, such as glass, or an organic insulating material, such as plastic or polyimide (PI).

In FIG. 3, the upper side of the upper surface 100*a* of the substrate 100 may be the front side, and the lower side of the lower surface 100*b* of the substrate 100 may be the rear side.

The substrate 100 includes the display area AA and the peripheral area PA, as described above.

A lower pattern 110 may be positioned on the upper surface 100*a* of the substrate 100.

The lower pattern 110 may have a light-blocking function. The lower pattern 110 may include metal, but the material is not limited thereto. The lower pattern 110 may be omitted in one or more other embodiments.

A buffer layer 120 may be positioned on the lower pattern 110, and an active pattern 130 may be positioned on the buffer layer 120. The active pattern 130 may include a semiconductor material, such as amorphous silicon, polycrystalline silicon, or an oxide semiconductor. The active pattern 130 may include the channel region 132 and the conductive regions 131 and 133 of the transistor TT, which may be a transistor included in a pixel circuit of the pixel PX.

A first insulating layer 141 may be positioned on the active pattern 130, and a first conductive layer 160*a* including a gate electrode 161*a* of the transistor TT may be positioned thereon.

Scan lines and control lines connected to the transistors may be positioned on the first conductive layer 160*a*.

A second insulating layer 142 may be positioned on the first conductive layer 160*a*, and a second conductive layer 160*b* may be positioned thereon.

A portion of the second conductive layer 160*b* may overlap a portion of the first conductive layer 160*a* to form a capacitor.

A third insulating layer 143 may be positioned on the second conductive layer 160*b*, and a third conductive layer including connection members 170*a* and 171*a* may be positioned thereon.

The connection members 170*a* and 171*a* may respectively connect to the conductive regions 131 and 133 of the active pattern 130 through openings of the first insulating layer 141, the second insulating layer 142, and the third insulating layer 143, respectively.

A fourth insulating layer 144 may be positioned on the third conductive layer, and a fifth insulating layer 145 may be positioned thereon.

A fourth conductive layer 171*b* including a connection member 170*b* may be positioned on the fifth insulating layer 145.

The connection member 170*b* may be electrically connected to the connection member 170*a* of the third conductive layer through openings of the fourth insulating layer 144 and the fifth insulating layer 145.

A sixth insulating layer 146 may be positioned on the fourth conductive layer 171*b*, and a seventh insulating layer 147 may be positioned thereon.

A fifth conductive layer 171*c* including a connection member 170*c* may be positioned on the seventh insulating layer 147.

The connection member 170*c* may be electrically connected to the connection member 170*b* of the fourth conductive layer through openings of the sixth insulating layer 146 and the seventh insulating layer 147.

An eighth insulating layer 148 may be positioned on the fifth conductive layer 171*c*, and a ninth insulating layer 149 may be positioned thereon.

A sixth conductive layer including an anode pad 170, a cathode pad 171, and a front data pad 175 may be positioned on the ninth insulating layer 149.

The anode pad 170 may be electrically connected to the connection member 170*c* of the fifth conductive layer 171*c* through openings in the eighth insulating layer 148 and the ninth insulating layer 149.

The sixth conductive layer may include two or more layers including different conductive materials. For example, the anode pad 170 may include a lower conductive layer 170*d* and an upper conductive layer 170*e*, the cathode pad 171 may include a lower conductive layer 171*d* and an upper conductive layer 171*e*, and the front data pad 175 may include a lower conductive layer 175*d* and an upper conductive layer 175*e*.

The lower conductive layers 170*d*, 171*d*, and 175*d* may be formed of a single- or multi-layered metal, and the upper conductive layers 170*e*, 171*e*, and 175*e* may include a transparent conductive material, such as ITO or IZO.

The anode pad 170 may be connected to the transistor TT through several connection members 170*a*, 170*b*, and 170*c* to receive a data voltage.

The transistor TT, the anode pad 170 and the cathode pad 171 may be positioned in the planar display area AA.

A tenth insulating layer 150 may be positioned on the sixth conductive layer, and an eleventh insulating layer 151 may be positioned thereon.

The tenth insulating layer 150 and the eleventh insulating layer 151 have (e.g., define) openings 50, 51, and 52 that expose the anode pad 170, cathode pad 171, and front data pad 175, respectively.

A twelfth insulating layer 152 may be positioned below the lower surface 100*b* of the substrate 100. Part of the twelfth insulating layer 152 may be patterned to form an alignment key 80, as shown in FIG. 1 and FIG. 2, and as described above.

A seventh conductive layer including the rear data pad 176 may be positioned under the twelfth insulating layer 152. The seventh conductive layer may include two or more layers including different conductive materials. For example, the rear data pad 176 may include a lower conductive layer 176*f* and an upper conductive layer 176*g*.

The lower conductive layer 176*f* may be formed of a single-layered or multi-layered metal, and the upper conductive layer 176*g* may include a transparent conductive material, such as ITO or IZO.

The front data pad 175 and the rear data pad 176 may be positioned in the peripheral area PA on a plan view.

A thirteenth insulating layer 153 may be positioned below the seventh conductive layer, and a fourteenth insulating layer 154 may be positioned below it. The thirteenth insulating layer 153 and the fourteenth insulating layer 154 have (e.g., define) openings 55 exposing the rear data pad 176.

The buffer layer 120, the first insulating layer 141, the second insulating layer 142, the third insulating layer 143, the fourth insulating layer 144, the fifth insulating layer 145, the sixth insulating layer 146, the seventh insulating layer 147, the eighth insulating layer 148, the ninth insulating layer 149, the tenth insulating layer 150, the eleventh insulating layer 151, the twelfth insulating layer 152, the thirteenth insulating layer 153, and the fourteenth insulating layer 154 may include inorganic insulating materials, such as silicon nitride ($SiN_x$), silicon oxide ($SiO_x$), silicon oxynitride ($SiO_xN_y$), and/or organic insulating materials, such as polyimide resin and polyacrylic resin.

For example, at least one of the buffer layer 120, the first insulating layer 141, the second insulating layer 142, the third insulating layer 143, the fifth insulating layer 145, the seventh insulating layer 147, the ninth insulating layer 149, the eleventh insulating layer 151, the twelfth insulating layer 152, and/or the fourteenth insulating layer 154 may include inorganic insulating material, and at least one of the fourth insulating layer 144, the sixth insulating layer 146, the eighth insulating layer 148, the tenth insulating layer 150, and/or the thirteenth insulating layer 153 may include organic insulating material.

At least one of the first conductive layer 160*a*, the second conductive layer 160*b*, the third conductive layer, the fourth conductive layer 171*b*, and/or the fifth conductive layer 171*c* may include at least one metal, such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and/or their alloys, etc., and these layers may be made up of a single layer or of multiple layers.

Multiple data lines connected to the pixel circuit, signal lines, such as driving voltage lines, and voltage lines may be formed on at least one layer of the second conductive layer 160*b*, the third conductive layer, the fourth conductive layer 171*b*, the fifth conductive layer 171*c*, and/or the sixth conductive layer.

A plurality of light-emitting diodes 400 are positioned on the front surface of the display device. The light-emitting diode 400 may be in the form of a semiconductor chip, and may emit basic color light, such as red light, green light, and blue light. However, the color of light that the light-emitting diode 400 may emit is not limited thereto.

The light-emitting diode 400 may be electrically connected to the anode pad 170 and the cathode pad 171. For example, the light-emitting diode 400 may include an anode 301 that may be electrically connected to the anode pad 170 through the opening 50, and may include a cathode 302 that may be electrically connected to the cathode pad 171 through the opening 51.

The anode 301 and the cathode 302 may be electrically connected to the anode pad 170 and the cathode pad 171, respectively, through a conductive bonding material, such as an anisotropic conductive film or solder.

A display device according to one or more embodiments includes a side wire 200. The side wire 200 is formed along the side surface of the display device. The side wire 200 includes a front portion 200*a* positioned on the front surface of the peripheral area PA of the display device, a rear portion 200*c* positioned on the rear surface of the peripheral area PA of the display device, and a side portion 200*b* extending along the first direction DR1 from the side of the edge.

The front portion 200*a* of the side wire 200 may be formed to be electrically connected to the front data pad 175 through the opening 52, and the rear portion 200*c* may be formed to be electrically connected to the rear data pad 176 through the opening 55.

A pixel circuit of a pixel of the display device according to one or more embodiments will be described with reference to FIG. 4 along with the previously described drawings. The pixel circuit described here is only an example, and the pixel circuit is not limited thereto.

Figure 4:
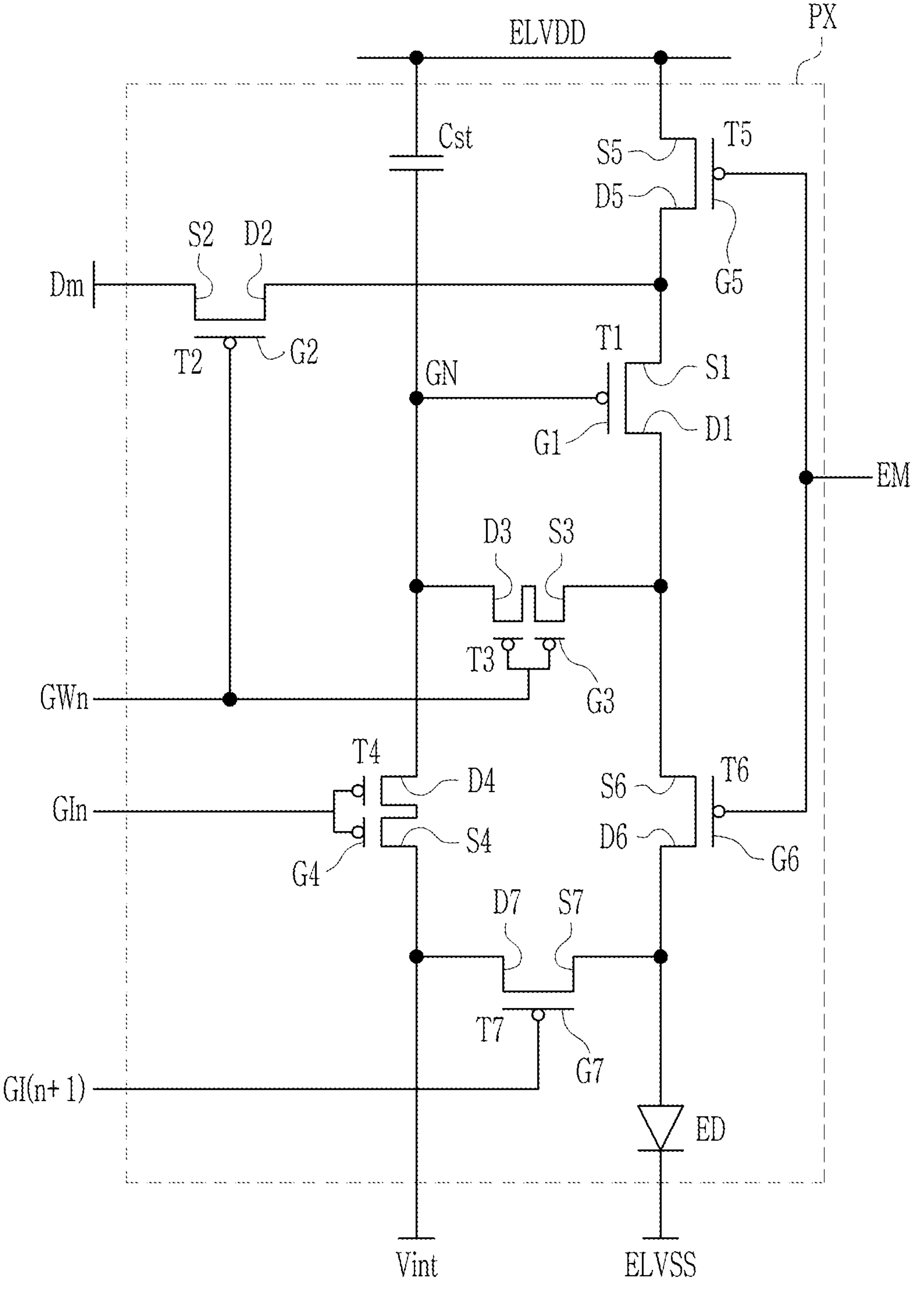
FIG. 4 is a pixel circuit diagram of one pixel of a display device according to one or more embodiments.

FIG. 4 is a pixel circuit diagram of one pixel of the display device according to one or more embodiments.

Referring to FIG. 4, a pixel PX may include multiple signal lines for transmitting multiple signals or voltages GWn, GIn, GI(n+1), EM, Dm, Vint, ELVSS, ELVDD, multiple transistors T1, T2, T3, T4, T5, T6, and T7, capacitors Cst, and at least one light-emitting diode ED.

One pixel PX may include one light-emitting diode ED.

The plurality of scan signals GWn, GIn, and GI(n+1) may be transferred by the plurality of scan signals, and a gate-on voltage and a gate-off voltage capable of turning on/off the transistors T2, T3, T4, T7 voltage may be delivered.

If the scan signal GWn is the nth scan signal applied during one frame, the scan signal GIn could be the (n−1)th scan signal (e.g., the previous scan signal), and the scan signal GI(n+1) could be the nth scan signal, and so on.

The control signal EM is a signal capable of controlling light emission of the light-emitting diode ED, and may transmit a gate-on voltage and a gate-off voltage.

The data signal Dm may be transmitted through the data line, and the driving voltage ELVDD may be transmitted through the driving voltage line.

The gate electrode G1 of the first transistor T1 is connected to one end of the capacitor Cst through the drive gate node GN, the source electrode S1 of the first transistor T1 is connected to the drive voltage ELVDD via the fifth transistor T5, and the drain electrode D1 of the first transistor T1 is connected to the anode of the light-emitting diode ED via the sixth transistor T6.

The gate electrode G2 of the second transistor T2 is connected to the scan signal GWn, the source electrode S2 of the second transistor T2 is connected to the data signal Dm, and the drain electrode D2 of the second transistor T2 is connected to the source electrode S1 of the first transistor T1 while also being connected to the drive voltage ELVDD via the fifth transistor T5. The second transistor T2 may be turned on according to the scan signal GWn, and may deliver the data signal Dm to the source electrode S1 of the first transistor T1.

The gate electrode G3 of the third transistor T3 is connected to the scan signal GWn, and the source electrode S3 of the third transistor T3 is connected to the drain electrode D1 of the first transistor T1, and is also connected to the anode of the light-emitting diode ED via the sixth transistor T6. The drain electrode D3 of the third transistor T3 is connected to the drain electrode D4 of the fourth transistor T4, one end of the capacitor Cst, and the gate electrode G1 of the first transistor T1. The third transistor T3 may be turned on according to the scan signal GWn, and may connect the gate electrode G1 and drain electrode D1 of the first transistor T1 to each other.

The gate electrode G4 of the fourth transistor T4 is connected to the scan signal GIn, the source electrode S4 of the fourth transistor T4 is connected to the initialization voltage Vint, and the drain electrode D4 of the fourth transistor T4 is connected to the capacitor Cst, to the gate electrode G1 of the first transistor T1, and to the drain electrode D3 of the third transistor T3. The fourth transistor T4 may be turned on according to the scan signal GIn, and may deliver the initialization voltage Vint to the gate electrode G1 of the first transistor T1, thereby being able to initialize the voltage of the gate electrode G1 of the first transistor T1.

The gate electrode G5 of the fifth transistor T5 is connected to the control signal EM, the source electrode S5 of the fifth transistor T5 is connected to the drive voltage ELVDD, and the drain electrode D5 of the fifth transistor T5 is connected to the source electrode S1 of the first transistor T1 and to the drain electrode D2 of the second transistor T2.

The gate electrode G6 of the sixth transistor T6 is connected to the control signal EM, the source electrode S6 of the sixth transistor T6 is connected to the drain electrode D1 of the first transistor T1 and to the source electrode S3 of the third transistor T3, and the drain electrode D6 of the sixth transistor T6 is electrically connected to the anode of the light-emitting diode ED.

The fifth transistor T5 and the sixth transistor T6 are concurrently or substantially simultaneously turned on according to the control signal EM, and through this, the driving voltage ELVDD may be compensated through the first transistor T1 and delivered to the light-emitting diode ED.

The gate electrode G7 of the seventh transistor T7 is connected to the scan signal GI(n+1), the source electrode S7 of the seventh transistor T7 is connected to the drain electrode D6 of the sixth transistor T6 and to the anode of the light-emitting diode ED, and the drain electrode D7 of the seventh transistor T7 is connected to the initialization voltage Vint and to the source electrode S4 of the fourth transistor T4.

One end of the capacitor Cst is connected to the gate electrode G1 of the first transistor T1, and the other end is connected to the driving voltage ELVDD.

A cathode of the light-emitting diode ED is connected to the common voltage ELVSS.

The light-emitting diode ED indicated in FIG. 4 may be the light-emitting diode 400 described in FIG. 3, and multiple signal lines, voltage lines, transistors T1, T2, T3, T4, T5, T6, and T7 and/or capacitor(s) Cst may be made up of various conductive layers and insulating layers of FIG. 3.

The structure of the pixel PX is not limited to the structure shown in FIG. 4, and the number of transistors and capacitors included in one pixel PX and the connection relationship may be variously modified.

A manufacturing method of a display device, including a peripheral structure of a rear data pad 176, and a method of forming a side wire, according to one or more embodiments, will be described with reference to FIG. 5 and FIG. 6 along with the drawings described above.

Figure 5:
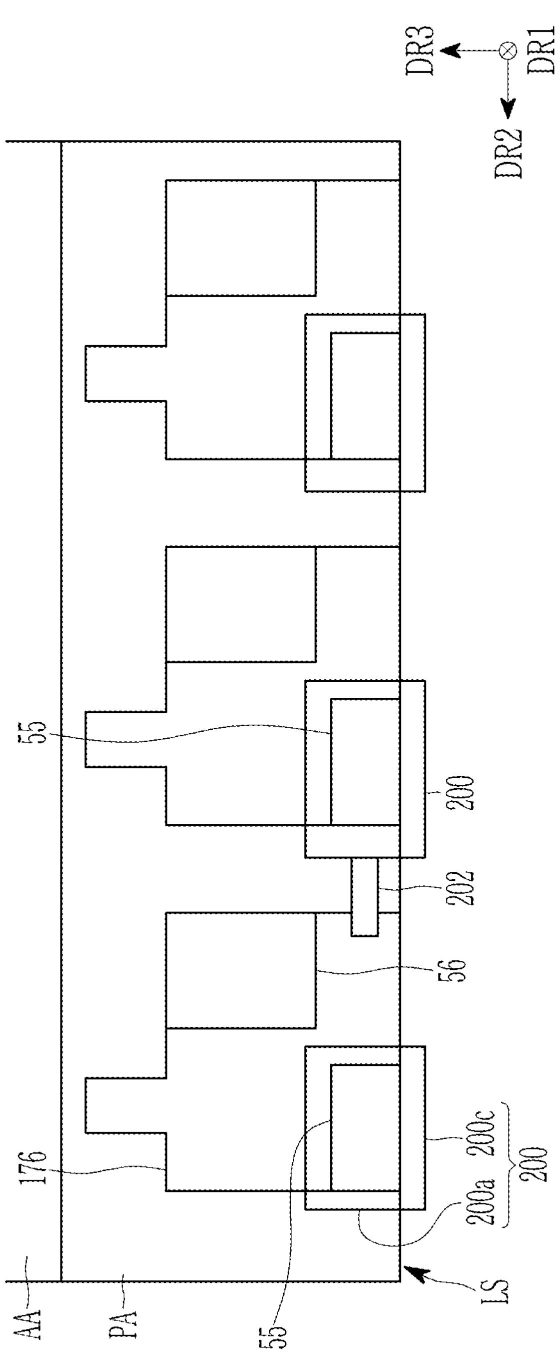
FIG. 5 is a plan view of a portion of the rear surface of a display device according to one or more embodiments.
Figure 6:
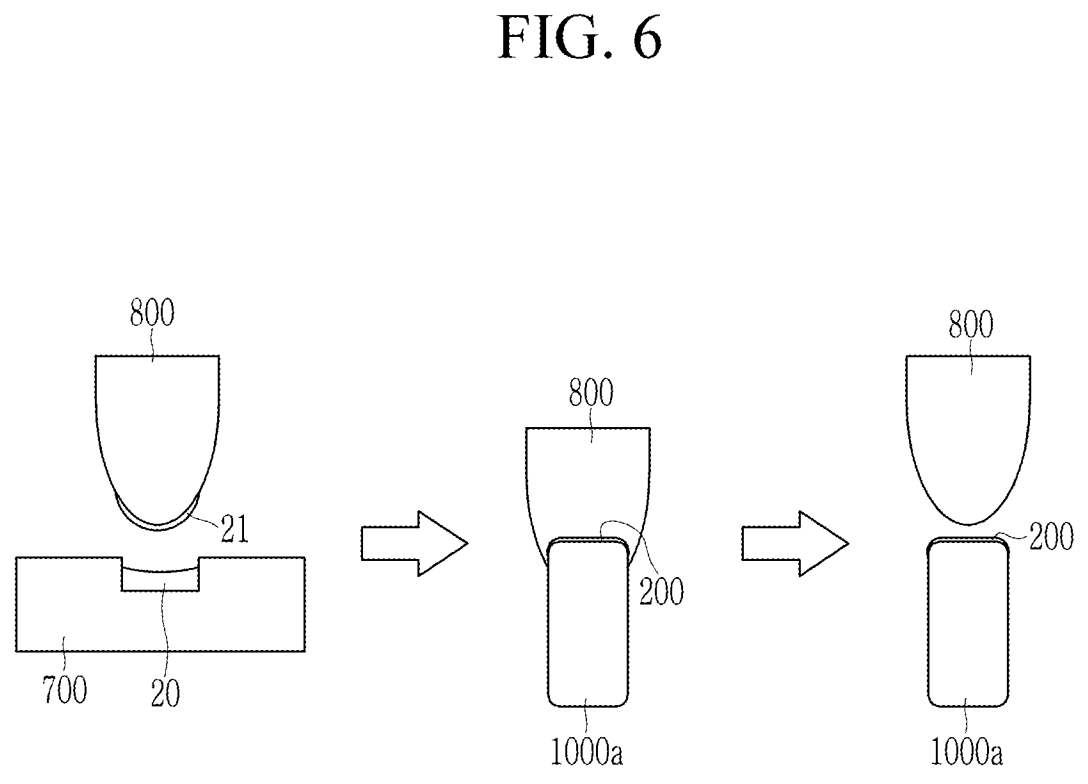

FIG. 5 is a plan view of a part of the rear surface of the display device according to one or more embodiments, and FIG. 6 is a diagram illustrating a process of forming side wires of the display device according to one or more embodiments.

Referring to FIG. 5, a plurality of rear data pads 176 positioned on the rear surface of the display device are spaced apart from each other in the second direction DR2. A planar shape of each rear data pad 176 may be approximately rectangular.

Each rear data pad 176 has (e.g., defines) an opening 55 and an inspection opening 56 positioned on it, and may overlap on a flat surface with the opening 55 and the inspection opening 56. The opening 55 and inspection opening 56 may be formed in the thirteenth insulating layer 153 and the fourteenth insulating layer 154 previously described with respect to FIG. 3, thereby revealing the rear data pad 176.

The opening 55 is for electrically connecting the rear data pad 176 to the front data pad 175 through the side wire 200. The inspection opening 56 may not be connected to the side wire 200, but during or after the manufacturing process of the display device, the inspection opening 56 may be for applying a test signal to the rear data pad 176 through a probe pin or the like.

A plane shape of each of the openings 55 and the inspection opening 56 overlapping each rear data pad 176 may be approximately rectangular.

In a plan view, the opening 55 may be positioned closer to the long side LS of the display device than the inspection opening 56. That is, the opening 55 positioned on each rear data pad 176 may be closer to the long side LS of the display device than the inspection opening 56 in the third direction DR3.

Here, the long side LS is a longer side among edge sides of the display device described above.

Therefore, in FIG. 5, the display area AA may be positioned on the side that is opposite to the long side LS with the peripheral area PA interposed therebetween.

For example, a virtual line or plane extending in the second direction DR2 of the opening 55 on each rear data pad 176 may not overlap the inspection opening 56.

In FIG. 5, the horizontal side of the upper end of the opening 55 may be positioned closer to the long side LS than the horizontal side of the lower side of the inspection opening 56.

The openings 55 positioned on each rear data pad 176 are separated from the inspection openings 56, and may be positioned on one side of the rear data pad in the second direction DR2, and the inspection openings 56 may be positioned on the other side of the rear data pad with respect to the second direction DR2. For example, when the opening 55 positioned on each rear data pad 176 is on the left, the inspection opening 56 may be on the right, and such arrangement may be repeated substantially identically for multiple neighboring rear data pads 176.

For example, a virtual line or surface extended in the third direction DR3 from the opening 55 on each rear data pad 176 may not overlap the inspection opening 56. That is, in FIG. 5, the right vertical side of the opening 55 may be positioned to the left of the left vertical side of the inspection opening 56.

In contrast, when the opening 55 positioned in each rear data pad 176 is positioned on the right side, the inspection opening 56 may be positioned on the left side, and this arrangement is made with respect to a plurality of adjacent rear data pads 176, and the same may be repeated.

Referring to FIG. 5, when the opening 55 is positioned near a corner of the rear data pad 176 on the long side LS, the inspection opening 56 may be positioned near another corner facing diagonally from the corner. The arrangement of the opening 55 and inspection opening 56 on each rear data pad 176 may be substantially identically repeated for a plurality of neighboring rear data pads 176.

The arrangement of the openings 55 and inspection openings 56 on each rear data pad 176 shown in FIG. 5 may also be reversed horizontally (e.g., reversed in the second direction DR2).

The side wire 200 corresponding to each rear data pad 176 may cover each opening 55, and may be electrically connected to the rear data pad 176 through the opening 55. The side wire 200 may be formed of a metal, such as silver (Ag) through a printing method or the like.

Referring to FIG. 6, the method of manufacturing a display device according to one or more embodiments involves laminating multiple insulating layers and conductive layers on the front and back of the substrate 100 shown in FIG. 3, and involves patterning to form multiple front data pads 175, multiple anode pads 170, multiple cathode pads 171, multiple rear data pads 176, etc., and may include the operation of forming a side wire 200.

The method of forming the side wire 200 involves placing the conductive material 20 positioned in the engraved part of the intaglio plate 700 on a printing pad 800, so that the transferred conductive material layer 21 is positioned on the printing pad 800. The printing pad 800 may be made of an elastic material, such as silicon. The conductive material 20 positioned on the intaglio plate 700 may be in a molten state or may be dissolved in a solvent.

Next, by pressing the printing pad 800 on the side of the display device 1000*a* where several insulating layers and conductive layers are laminated on the substrate 100, the transferred conductive material layer 21 is transferred to the side of the display device 1000*a*, thereby forming a side wire 200. At this time, one side wire 200 may be formed by one press, or a plurality of side wires 200 may be formed by one press.

Next, the printing pad 800 is separated from the display device 1000*a*, and the formed side wire 200 is dried or a solvent is removed. However, the method of forming the side wire 200 is not limited thereto.

In the process of forming the side wire 200, residues 202 connected to at least one side wire 200 may remain. The residue 202 contains materials, such as the side wire 200, and is positioned on the same layer as the rear portion 200*c* of the side wire 200. The residue 202 may have a width in the third direction DR3 that is less than or equal to the width of the side wire 200 in the third direction DR3. The residue 202 may protrude toward the rear data pad 176 adjacent to the connected side wire 200.

As shown in FIG. 5, such residues 202 may cross over to and overlap adjacent rear data pads 176. In this case, if the inspection opening 56 is extended downward to the right of the opening 55, the residue 202 of the side wire 200 connected to the neighboring rear data pad 176 is electrically connected to the neighboring rear data pad 176 through the inspection opening 56, causing a short-circuit defect between the two neighboring rear data pads 176.

However, the inspection opening 56 is positioned in an area farther from the edge of the display device than the opening 55, without including a portion adjacent to the left or right side of the opening 55 for connecting the front data pad 175 and the rear data pad 176 through the side wire 200 (e.g., without including a portion adjacent in the second direction DR2 or the long side LS direction). Therefore, even if the residue 202 protrudes from the adjacent side wire 200 in the second direction DR2, the risk of overlapping the inspection opening 56 on the adjacent rear data pad 176 to be electrically connected thereto is reduced, and the likelihood of a short-circuit defect between neighboring rear data pads 176 may be reduced or prevented.

A manufacturing method of the display device, including a peripheral structure of the rear data pad 176 and a method of forming a side wire, according to one or more embodiments will be described with reference to FIG. 7 to FIG. 9.

Figure 7:
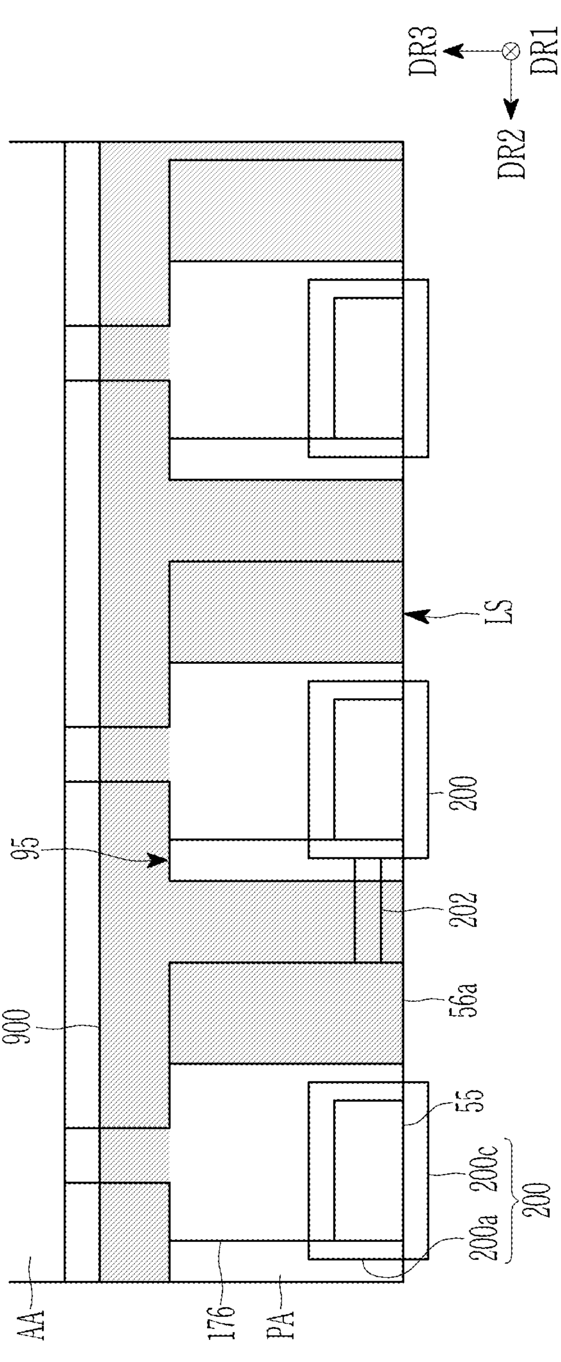
FIG. 7 is a plan view of a portion of a rear surface of a display device in a process of forming side wires of the display device according to one or more embodiments.
Figure 8:
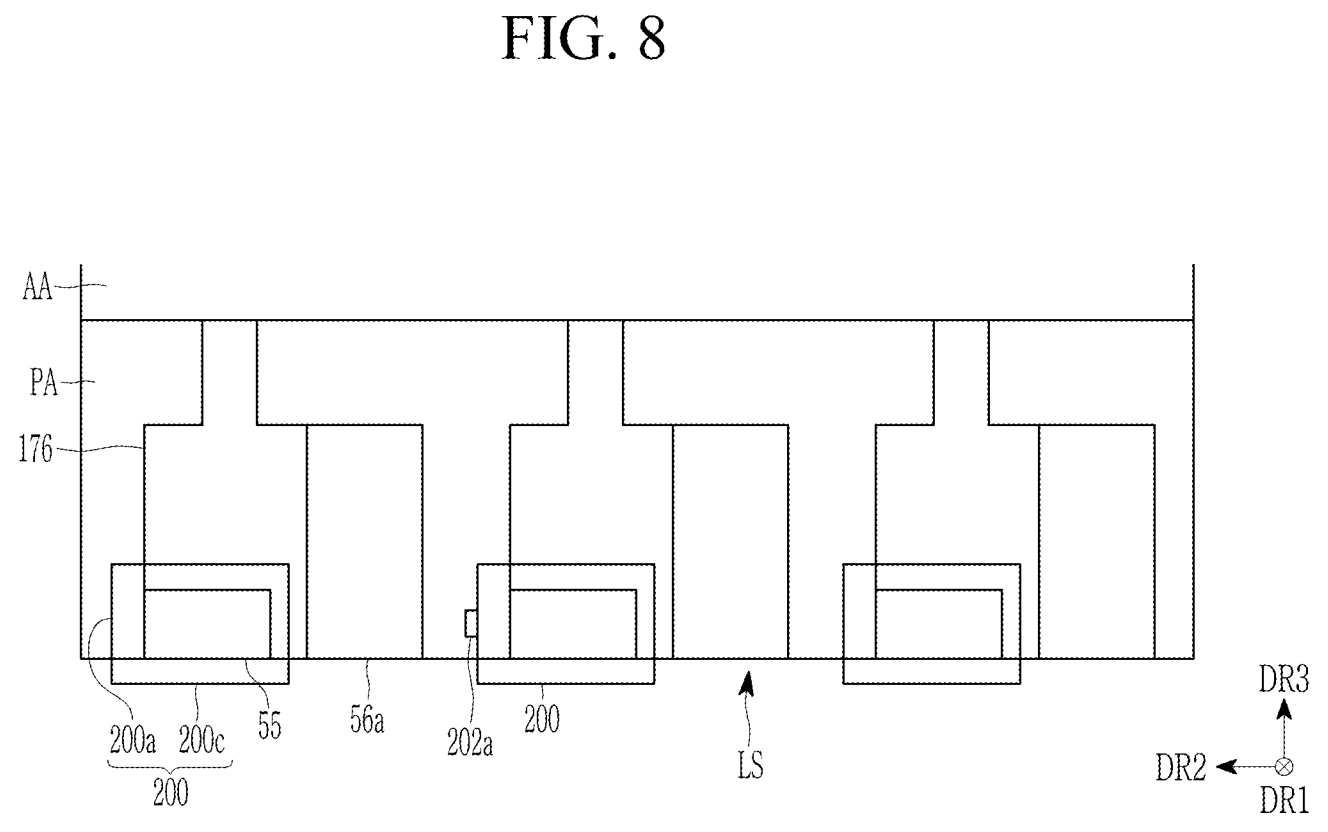
Figure 9:
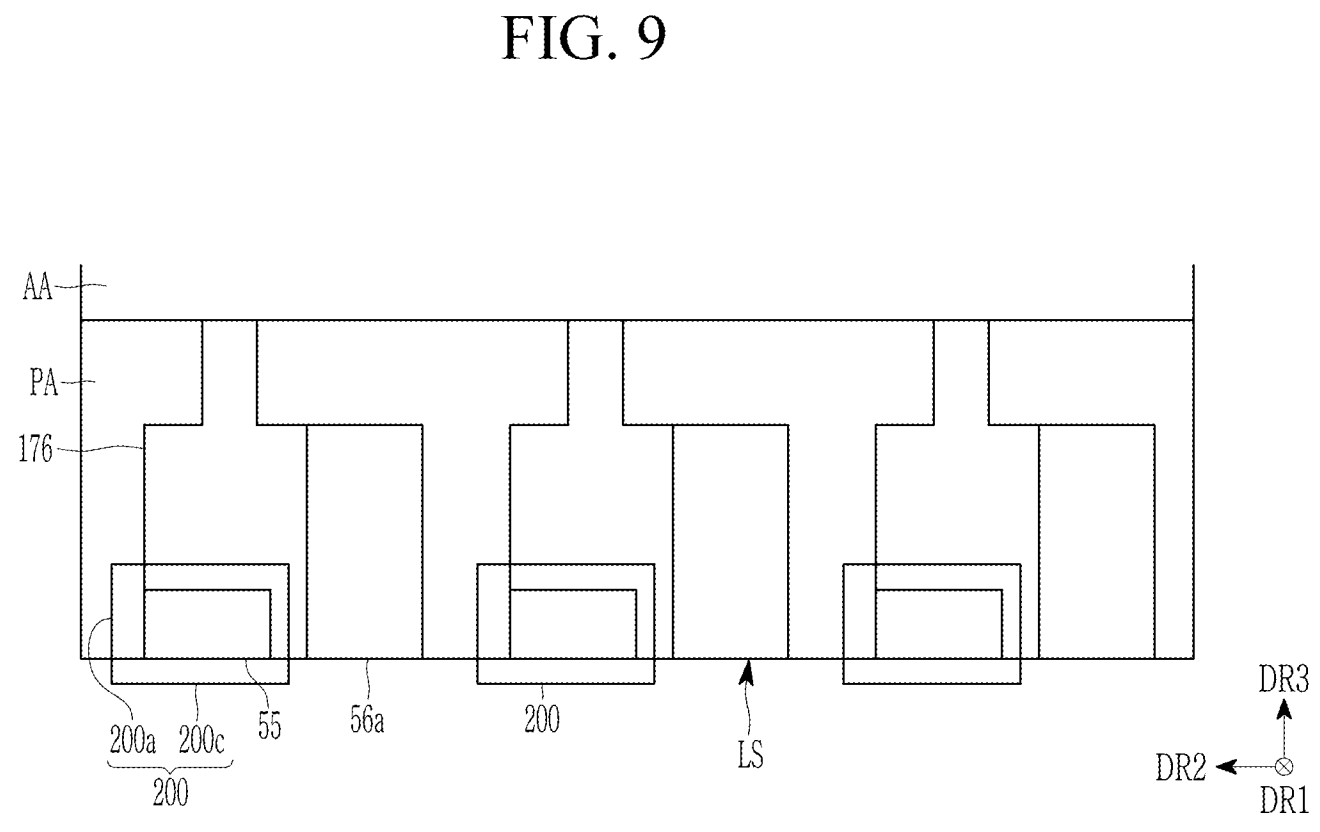

FIG. 7 is a plan view of a portion of the rear surface of the display device in a process of forming side wires of the display device according to one or more embodiments, FIG. 8 is a plan view of a portion of the rear surface of the display device according to one or more embodiments, and FIG. 9 is a plan view of a part of the rear surface of the display device according to one or more embodiments.

An opening 55 and an inspection opening 56*a* are positioned in each rear data pad 176, and may overlap each rear data pad 176 on a plane. The opening 55 and the inspection opening 56*a* may be formed in the thirteenth insulating layer 153 and the fourteenth insulating layer 154 shown in FIG. 3 and described above to expose the rear data pad 176.

The opening 55 is for electrically connecting the rear data pad 176 to the front data pad 175 through the side wire 200, and the inspection opening 56*a* is not connected to the side wire 200, but the display device may allow application of an inspection signal to the rear data pad 176 through a probe pin or the like during or after the manufacturing process.

A plane shape of each of the opening 55 and the inspection opening 56*a* overlapping each rear data pad 176 may be approximately rectangular. In a plan view, the inspection opening 56*a* may have the same shape as the inspection opening 56 described above, and may be longer in the third direction DR3 than the inspection opening 56 described above, as shown in FIG. 7 to FIG. 9.

Referring to FIG. 7 to FIG. 9, the inspection opening 56*a* positioned on each rear data pad 176 may be spaced apart from the opening 55 in the second direction DR2. A virtual line or plane extending in the second direction DR2 from the opening 55 on each rear data pad 176 may overlap the inspection opening 56*a*.

The arrangement of the opening 55 and the inspection opening 56*a* on each rear data pad 176 may be substantially identically repeated for a plurality of neighboring rear data pads 176. The arrangement of the opening 55 and the inspection opening 56*a* on each rear data pad 176 shown in FIG. 7 to FIG. 9 may also be reversed horizontally (e.g., inverted in the second direction DR2).

The side wires 200 corresponding to each rear data pad 176 cover each opening 55, and may be electrically connected to the rear data pad 176 through the opening 55. The side wire 200 may be formed of a metal, such as silver (Ag) through a printing method or the like.

Referring to FIG. 7, the manufacturing method of the display device according to one or more embodiments is as described above, and the method illustrated in FIG. 6 may be used as the method of forming the side wire 200.

The passivation layer 900 may be additionally formed on the entire rear surface of the display device where the rear data pad 176 is formed, or in the peripheral area PA of the rear surface, before forming the side wire 200. The passivation layer 900 may be positioned on the thirteenth insulating layer 153 or the fourteenth insulating layer 154 shown in FIG. 3.

The passivation layer 900 may be formed in the form of a film by coating an organic material, such as polyimide-based resin or polyacrylic resin, on the rear surface of the display device using an inkjet method, and then curing the organic material, such as a polyimide-based resin, using a method, such as UV irradiation. The passivation layer 900 covers the plurality of rear data pads 176 of the peripheral area PA and an area between the rear data pads 176, but does not cover the opening 55. The passivation layer 900 may correspond to each of the plurality of openings 55 on the rear data pad 176, and may include (e.g., define) a plurality of openings 95 that reveal the openings 55.

The plurality of openings 95 may be spaced apart from each other in the second direction DR2. The openings 95 are adjacent the inspection openings 56*a* on the rear data pad 176 without exposing them (e.g., the passivation layer 900 may cover the inspection openings). Therefore, if a passivation layer 900 is formed on the rear of the display device and then the side wire 200 is formed, even if residue 202 protruding from the rear portion 200*c* of the side wire 200 occurs, the passivation layer 900 of the insulating material is located between the inspection opening 56*a* on the neighboring rear data pad 176 and the residue 202. Therefore, the likelihood of a short-circuit between the neighboring rear data pads 176 may be reduced or prevented.

Referring to FIG. 8, after forming the side wire 200 electrically connected to the rear data pad 176 through the opening 55, the passivation layer 900 may be removed from the rear surface of the display device.

A portion of the residue 202*a* positioned in the opening 95 of the passivation layer 900 may remain connected to at least one side wire 200 where the residue 202 is generated. A portion of the residue 202*a* is spaced apart from the edge of the adjacent rear data pad 176, and may also be spaced apart from the inspection opening 56*a*. A portion of the residue 202*a* includes the same material as the side wire 200, and is positioned on the same layer as the rear portion 200*c* of the side wire 200. A portion of the residue 202*a* may have a width in the third direction DR3 that is equal to or less than the width of the side wire 200 in the third direction DR3. A portion of the residue 202*a* may protrude toward the rear data pad 176 adjacent to the connected side wire 200.

Alternatively, as shown in FIG. 9, most of the residue 202 may be removed along with the removal of the passivation layer 900 to form a generally residue-free side wire 200. In the case of FIG. 9, the width of the opening 95 of the passivation layer 900 in the second direction DR2 may be less than the width of the opening 95 of the passivation layer 900 in the second direction DR2 in the case of FIG. 8.

A tiled display device according to one or more embodiments will be described with reference to FIG. 10 to FIG. 12 together with the previously described drawings.

Figure 10:
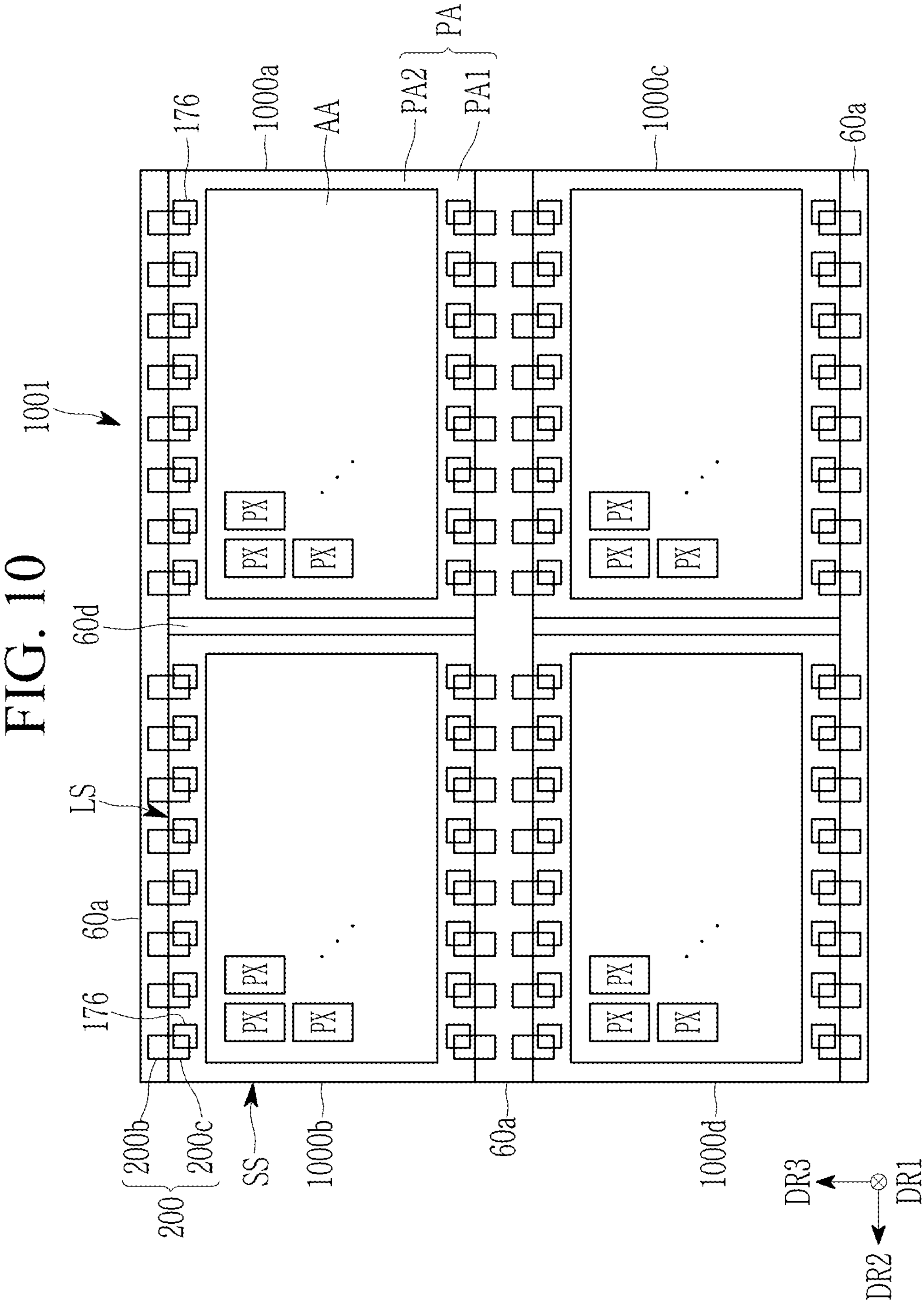
FIG. 10 is a rear plan view of a tiled display device according to one or more embodiments.
Figure 11:
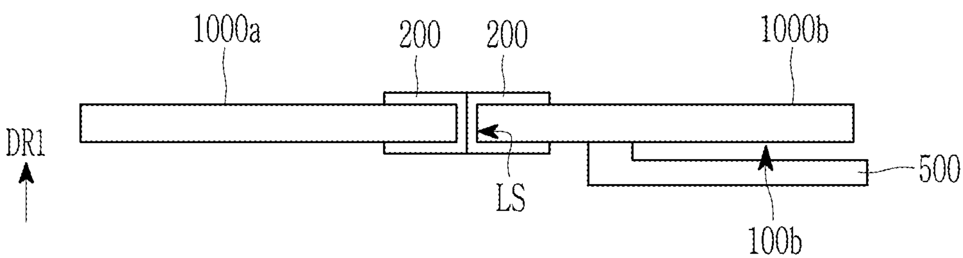
FIG. 11 is a schematic cross-sectional view of a portion of a tiled display device according to one or more embodiments.

FIG. 10 is a rear plan view of a tiled display device according to one or more embodiments, and FIG. 11 is a schematic cross-sectional view of a portion of the tiled display device according to one or more embodiments.

Referring to FIG. 10, a tiled display device 1001 according to one or more embodiments may include a plurality of display devices 1000*a*, 1000*b*, 1000*c*, and 1000*d* arranged in a matrix form and connected to each other. FIG. 10 illustrates four display devices 1000*a*, 1000*b*, 1000*c*, and 1000*d*, but the number of display devices included in the tiled display device according to one or more embodiments is not limited thereto. Each of the display devices 1000*a*, 1000*b*, 1000*c*, and 1000*d* may be the same as the display device described above. Each display device 1000*a*, 1000*b*, 1000*c*, and 1000*d* may be roughly rectangular, with multiple rear data pads 176 arranged along the long side LS, which is longer than the short side SS.

Multiple side wires 200 electrically connected to the rear data pads 176 may be formed along the long side LS. Each side wire 200 may include a rear portion 200*c* overlapping the rear surface of the display devices 1000*a*, 1000*b*, 1000*c*, and 1000*d*, and a side portion 200*b* positioned on the side surface.

The rear portion 200*c* of each side wire 200 may overlap, and may be connected to, a part of the rear data pad 176 by leaning toward, or being shifted toward, the left or right side in the second direction DR2 without covering the entire corresponding rear data pad 176. FIG. 10 shows each side wire 200 overlaps a part of the left side of the corresponding rear data pad 176 when viewed from the rear of the tiled display device 1001.

When viewing the tiled display device 1001 from the front, each side wire 200 may overlap a part of the right side of the corresponding front data pad 175, or each side wire 200 may overlap a part of the left side of the corresponding front data pad 175.

The peripheral area PA of each display device 1000*a*, 1000*b*, 1000*c*, and 1000*d* includes a first peripheral area PA1 adjacent to the long side LS, and a second peripheral area PA2 adjacent to the short side SS.

To connect adjacent display devices 1000*a*, 1000*b*, 1000*c*, and 1000*d*, an adhesive layer 60*a* may be applied on the long side LS of each display device 1000*a*, 1000*b*, 1000*c*, and 1000*d* on which the side wire 200 is formed, and when formed, display devices adjacent to each other in the third direction DR3 may be adhered to each other.

In addition, an adhesive layer 60*b* may be formed on the side surface of the short side SS of each of the display devices 1000*a*, 1000*b*, 1000*c*, and 1000*d* to adhere adjacent display devices to each other in the second direction DR2.

Referring to FIG. 11, the side wires 200 formed on the display devices 1000*a* and 1000*c* may face each other between the long sides LS of the adjacent display devices 1000*a* and 1000*c*.

In FIG. 11, the adhesive layers 60*a* and 60*b* between adjacent side wires 200 are omitted.

The rear data pad 176, which is connected to the front data pad 175 through the side wire 200, may be connected to a driving circuit (e.g., a driving circuit unit) 500 through the wire on the rear surface of the display device to receive data voltages. The driving circuit 500 may transmit various signals or voltages to the pixel circuit formed on the front surface of the display device through separate wires and side wires connected thereto. The driving circuit 500 may include a printed circuit board.

In this way, each display constituting the tiled display device is placed on the rear side of the tiled display device 1001 instead of the front side, and the front data pad is electrically connected to the drive circuit unit through the side wire 200, so the peripheral area PA of the display devices 1000*a*, 1000*b*, 1000*c*, and 1000*d* may be reduced. Therefore, the image quality may be improved by increasing the continuity of the image displayed by the tiled display device 1001.

Figure 12:
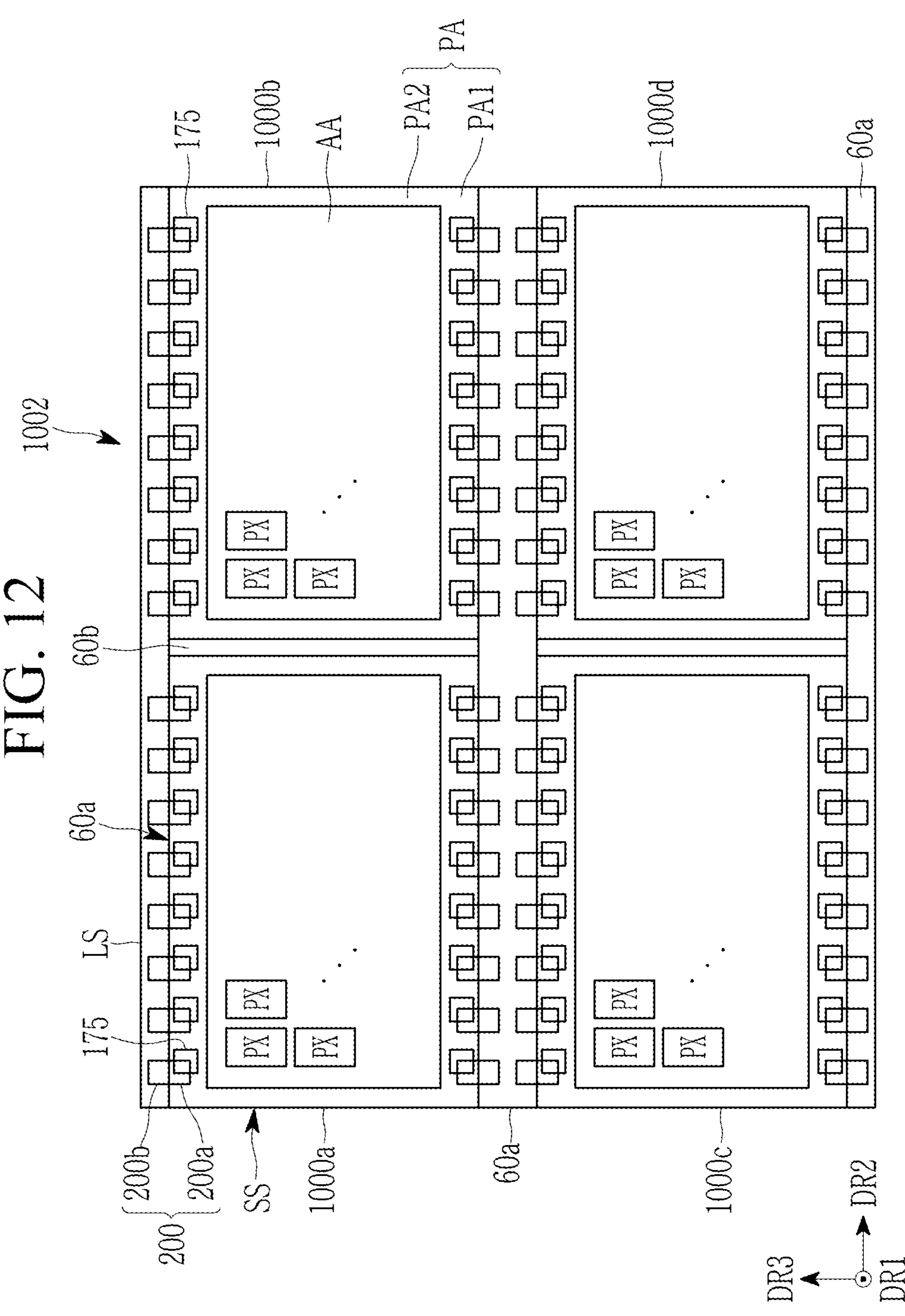
FIG. 12 is a front plan view of a tiled display device according to one or more embodiments.

FIG. 12 is a plan view of a tiled display device according to one or more embodiments.

Referring to FIG. 12, the tiled display device 1002 according to one or more embodiments is mostly the same as the previously described tiled display device 1001, but it shows each side wire 200 overlaps some of the left side of the corresponding front data pad 175.

When viewing the tiled display device 1002 from the rear, each side wire 200 may overlap a part of the right side of the corresponding rear data pad 176, or each side wire 200 may overlap a portion of the left side of the corresponding rear data pad 176, which may be the same as the one or more embodiments corresponding to FIG. 10 described above.

A peripheral structure of the front data pad 175 and a method of forming side wires of the display device according to one or more embodiments will be described with reference to FIG. 13 to FIG. 16 along with the previously described drawings.

Figure 13:
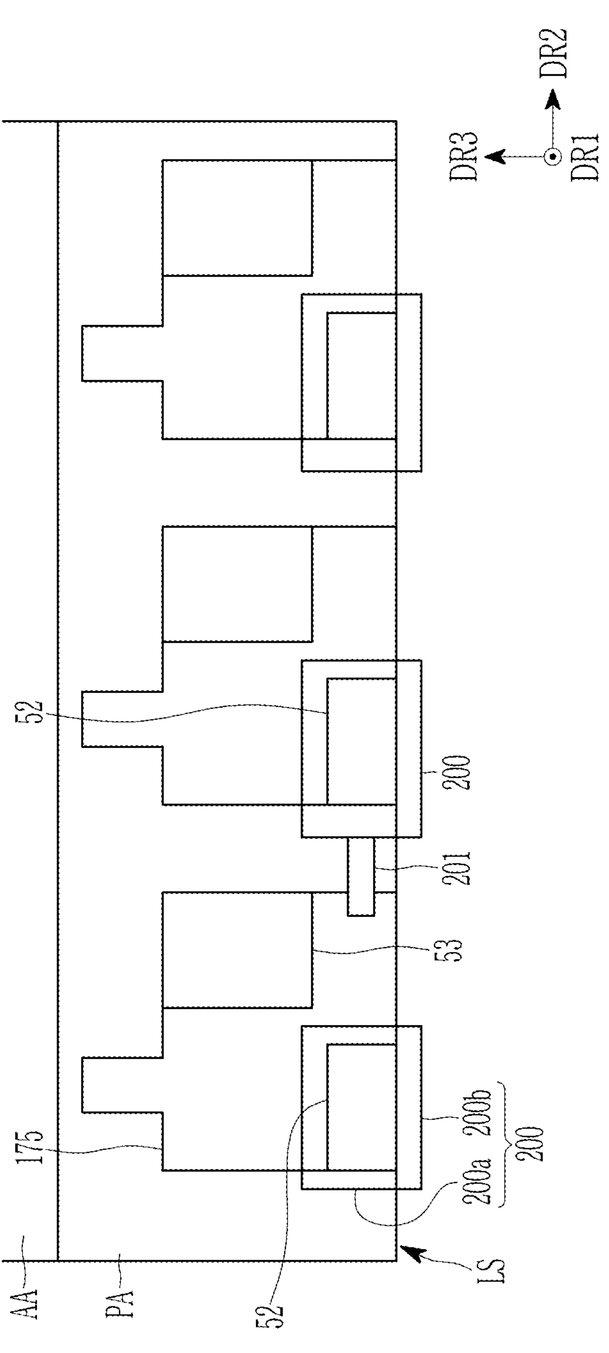
FIG. 13 is a plan view of a part of a front surface of a display device according to one or more embodiments.

FIG. 13 is a plan view of a portion of the front surface of the display device according to one or more embodiments.

Referring to FIG. 13, the plurality of front data pads 175 positioned on the front surface of the display device are spaced apart from each other in the second direction DR2. A planar shape of each front data pad 175 may be approximately rectangular.

An opening 52 and an inspection opening 53 are positioned with respect to each front data pad 175, which may overlap the opening 52 and the inspection opening 53 on a plane. The opening 52 and the inspection opening 53 may be formed in the tenth insulating layer 150 and the eleventh insulating layer 151 shown in FIG. 3 to expose the front data pad 175.

The opening 52 may enable the electrical connection of the front data pad 175 to the rear data pad 176 through the side wire 200, and the inspection opening 53 is not connected to the side wire 200, but the display device may allow the application of a test signal to the front data pad 175 through a probe pin or the like during the manufacturing process or after manufacturing.

A planar shape of each of the opening 52 and the inspection opening 53 overlapping each front data pad 175 may be approximately rectangular. In a plan view, the opening 52 may be positioned closer to the long side LS of the display device than the inspection opening 53. That is, the opening 52 positioned on each front data pad 175 may be positioned closer to the long side LS of the display device than the inspection opening 53 in the third direction DR3.

A virtual line or plane extending in the second direction DR2 form the opening 52 on each front data pad 175 may not overlap the inspection opening 53.

In FIG. 13, the upper horizontal side of the opening 52 may be closer to the long side LS than the lower horizontal side of the inspection opening 53.

The opening 52 corresponding to each front data pad 175 is spaced apart from the inspection opening 53, and is positioned on one side in the second direction DR2 while the inspection opening 53 is positioned on the other side in the second direction DR2. For example, when the opening 52 corresponding to each front data pad 175 is on the left, the inspection opening 53 may be on the right, and such arrangement may be repeated substantially identically for multiple neighboring front data pads 175.

For example, a virtual line or plane extending in the third direction DR3 from the opening 52 on each front data pad 175 may not overlap the inspection opening 53. That is, the right vertical side of the opening 52 in the path FIG. 13 may be located to the left of the left vertical side of the inspection opening 53.

In contrast, when the opening 52 of each front data pad 175 is positioned on the right side, the inspection opening 53 may be positioned on the left side, and this arrangement is suitable for a plurality of adjacent front data pads 175.

Referring to FIG. 13, when the opening 52 on each front data pad 175 is positioned close to one corner of the front data pad 175 positioned on the long side LS, the inspection opening 53 may be positioned close to another corner facing in a diagonal direction.

The arrangement of the opening 52 and inspection opening 53 on each front data pad 175 may be substantially identically repeated for a plurality of neighboring front data pads 175. The arrangement of the openings 52 and inspection openings 53 on each front data pad 175 shown in FIG. 13 may be horizontally reversed (e.g., reversed in the second direction DR2).

The side wires 200 corresponding to each front data pad 175 cover each opening 52, and may be electrically connected to the front data pad 175 through the opening 52.

Because the material and forming method of the side wire 200 are the same as those described above, a repeated description thereof will be omitted.

In the process of forming the side wire 200, residues 201 connected to the side wire 200 may remain. The residue 201 includes the same material as the side wire 200, and is positioned on the same layer as the front portion 200*a* of the side wire 200. The residue 201 may have a width in the third direction DR3 that is less than or equal to the width of the side wire 200 in the third direction DR3. The residue 201 may protrude toward the front data pad 175 adjacent to the connected side wire 200.

As shown in FIG. 13, such residues 201 may cross over to and overlap adjacent front data pads 175. In this case, if the inspection opening 53 extends downward to the right side of the opening 52, the residue 201 of the side wire 200 connected to the adjacent front data pad 175 passes through the inspection opening 53, and a short-circuit failure may occur between two adjacent front data pads 175 because they are electrically connected to the adjacent front data pads 175.

However, the inspection opening 53 does not include a portion adjacent to the left or right side of the opening 52 through the side wire 200 (e.g., a portion adjacent in the second direction DR2 or long side LS direction), and is positioned in a region further from the edge of the display device than the opening 52. Therefore, even if the residue 201 protrudes from the adjacent side wire 200 in the second direction DR2, the risk of overlapping the inspection opening 53 on the adjacent front data pad 175 and being electrically connected is reduced, so the likelihood of a short-circuit defect between neighboring front data pads 175 may be reduced or prevented.

Figure 14:
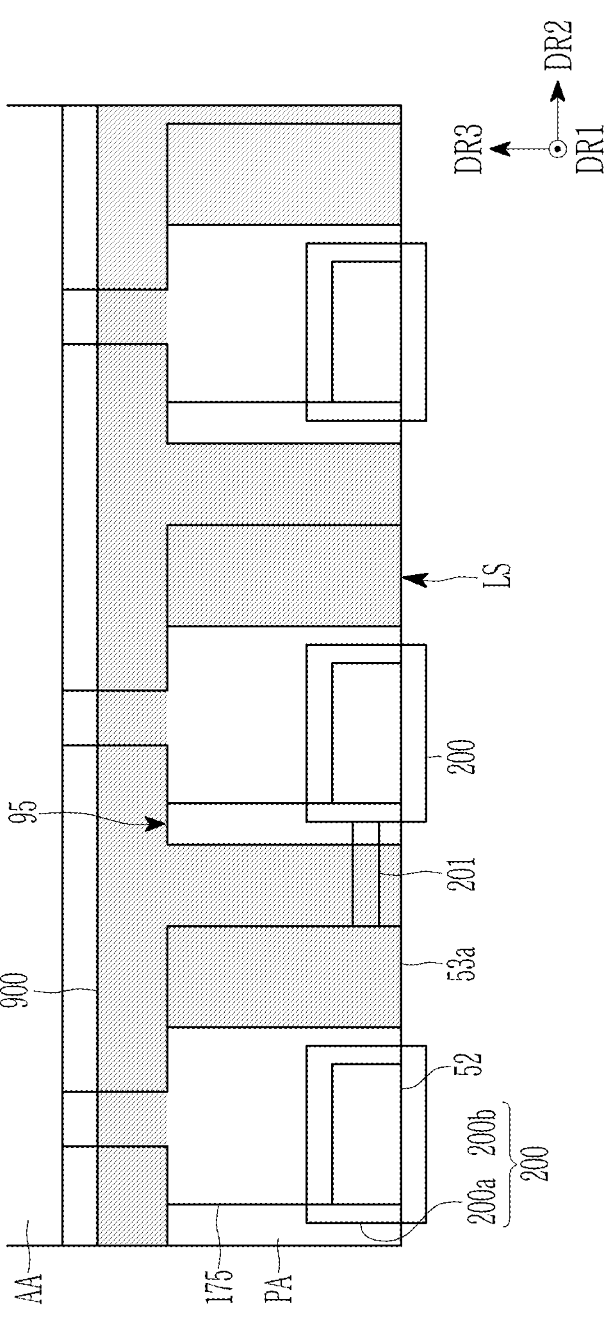
FIG. 14 is a plan view of a part of a front surface of a display device in a process of forming side wires of the display device according to one or more embodiments.
Figure 15:
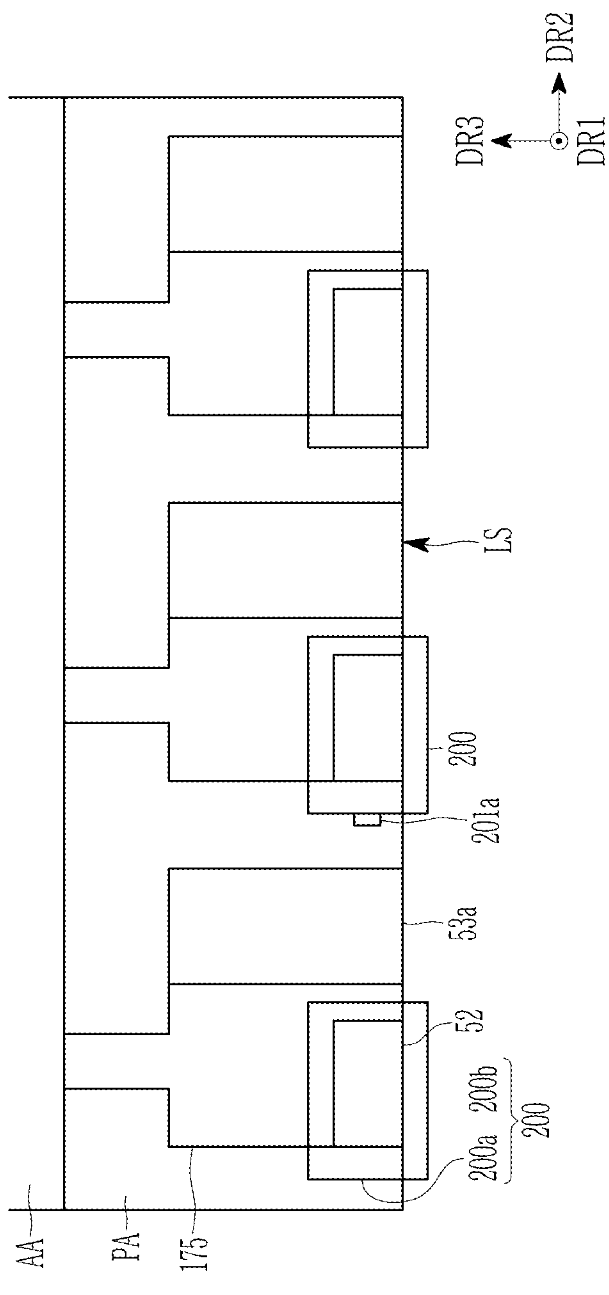
FIG. 15 is a plan view of a portion of a front surface of a display device according to one or more embodiments.
Figure 16:
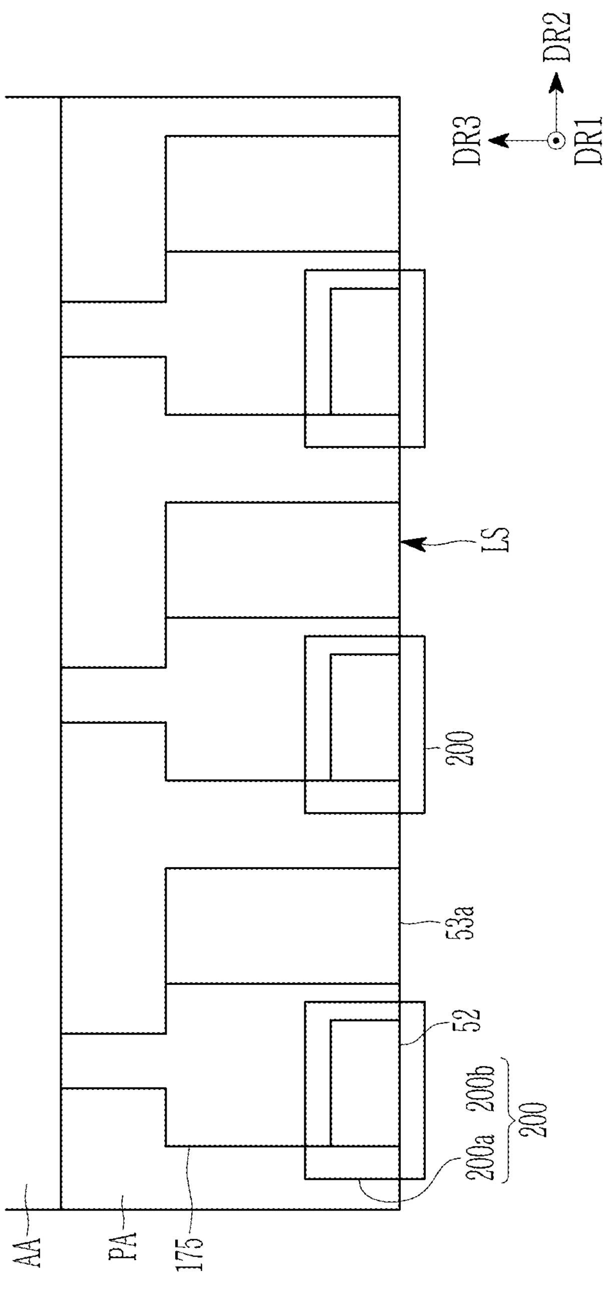
FIG. 16 is a plan view of a part of a front surface of a display device according to one or more embodiments.

FIG. 14 is a plan view of a portion of the front surface of the display device in a process of forming side wires of the display device according to one or more embodiments, FIG. 15 is a plan view of a portion of the front surface of the display device according to one or more embodiments, and FIG. 16 is a plan view of a portion of the front surface of the display device according to one or more embodiments.

An opening 52 and an inspection opening 53*a* are positioned corresponding to each front data pad 175, and may overlap each front data pad 175 on a plane. The opening 52 and the inspection opening 53*a* may be formed in the tenth insulating layer 150 and the eleventh insulating layer 151 shown in FIG. 3 to expose the front data pad 175.

The opening 52 is for electrically connecting the front data pad 175 to the rear data pad 176 through the side wire 200, and the inspection opening 53*a* is not connected to the side wire 200, but the display device may allow for applying a test signal to the front data pad 175 through a probe pin or the like during the manufacturing process or after manufacturing.

A planar shape of each of the opening 52 and the inspection opening 53*a* overlapping each front data pad 175 may be substantially rectangular. In a plan view, the inspection opening 53*a* may have the same shape as the inspection opening 53 described above, and as shown in FIG. 14 to FIG. 16, it may have a longer shape in the third direction DR3 than the inspection opening 53.

Referring to FIG. 14 to FIG. 16, the inspection opening 53*a* positioned corresponding to front data pad 175 may be spaced apart from the opening 52 in the second direction DR2.

A virtual line or plane extending in the second direction DR2 from the opening 52 on each front data pad 175 may overlap the inspection opening 53*a*.

The arrangement of the opening 52 and the inspection opening 53*a* on each front data pad 175 may be substantially identically repeated for adjacent front data pads 175. The arrangement of the opening 52 and the inspection opening 53*a* on each front data pad 175 shown in FIG. 14 to FIG. 16 may be horizontally reversed (e.g., reversed in the second direction DR2).

The side wires 200 corresponding to each front data pad 175 cover each opening 52, and may be electrically connected to the front data pad 175 through the opening 52.

Referring to FIG. 14, the method shown in FIG. 6 may be used as a method of forming side wires according to one or more embodiments, and additionally, the front data pad 175 may be formed before forming the side wires 200 of the display device, and the passivation layer 900 may be formed on the entire front surface or the peripheral area PA of the front surface.

The passivation layer 900 may be positioned on the tenth insulating layer 150 or the eleventh insulating layer 151 shown in FIG. 3. The passivation layer 900 may be formed in the form of a film by coating an organic material, such as polyimide-based resin or polyacrylic resin, on the entire surface of the display device by using an inkjet method, and by then curing the organic material by UV irradiation.

The passivation layer 900 may cover the plurality of front data pads 175 of the peripheral area PA and the area between the front data pads 175, but does not cover the opening 52. The passivation layer 900 may include a plurality of openings 95 exposing the openings 52 and corresponding to the plurality of openings 52 on the front data pad 175.

The opening 95 is adjacent inspection opening 53*a* on the front data pad 175 without exposing it (e.g., the passivation layer 900 may cover the inspection opening 53*a*). Therefore, after forming a passivation layer 900 on the front of the display device and forming a side wire 200, even if a residue 201 protruding from the front portion 200*a* of the side wire 200 occurs, a passivation layer 900 of insulating material is located between the inspection opening 53*a* on the neighboring front data pad 175 and the residue 201, thereby reducing or preventing the likelihood of a short failure between the neighboring front data pads 175.

Referring to FIG. 15, after forming the side wires 200, which are electrically connected to the front data pads 175 through the openings 52, the passivation layer 900 may be removed from the front surface of the display device.

A portion of the residue 201*a* positioned in the opening 95 of the passivation layer 900 may remain connected to the side wire 200 where the residue 201 was generated. A portion of the residue 201*a* may be spaced apart from the edge of the adjacent front data pad 175, and may also be spaced apart from the inspection opening 53*a*. A portion of the residue 201*a* includes the same material as the side wire 200, and is positioned on the same layer as the front portion 200*a* of the side wire 200. A portion of the residue 201*a* may have a width in the third direction DR3 that is equal to or less than the width of the side wire 200 in the third direction DR3. A portion of the residue 201*a* may protrude toward the front data pad 175 adjacent to the connected side wire 200.

Alternatively, as shown in FIG. 16, most of the residue 201 may be removed, along with removal of the passivation layer 900, to form a residue-free side wire 200.

In the case of FIG. 16, the width of the opening 95 of the passivation layer 900 in the second direction DR2 may be less than the width of the opening 95 of the passivation layer 900 in the second direction DR2 in the case of FIG. 15.

The display device according to one or more embodiments will be described with reference to FIG. 17.

Figure 17:
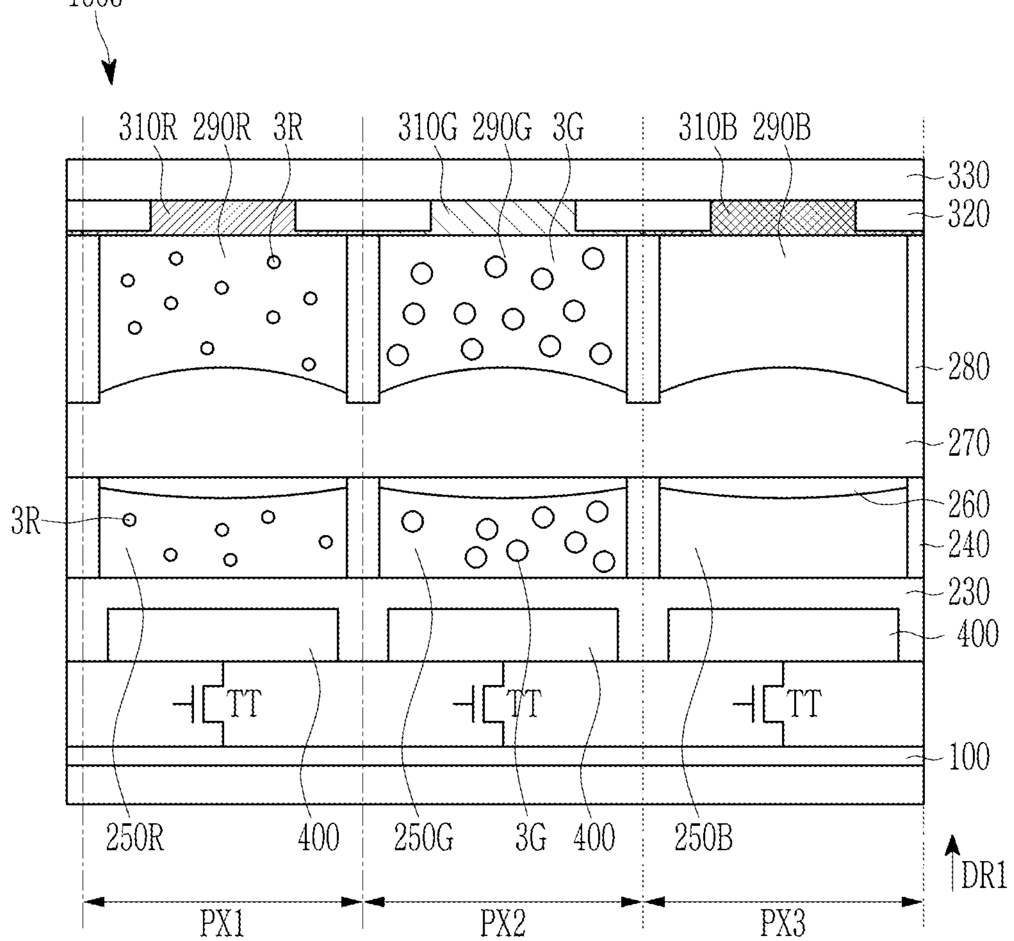
FIG. 17 is a cross-sectional view of a display device according to one or more embodiments.

FIG. 17 is a cross-sectional view of a display device according to one or more embodiments.

Referring to FIG. 17, a display device 1003 according to one or more embodiments is substantially the same as the previously described display device, but may further include a color conversion layer positioned on the light-emitting diode 400.

A plurality of pixels included in the display device 1003 according to one or more embodiments may include a first pixel PX1, a second pixel PX2, and a third pixel PX3 capable of displaying different colors. For example, the first pixel PX1 may emit red light, the second pixel PX2 may emit green light, and the third pixel PX3 may emit blue light.

Each of the pixels PX1, PX2, PX3 includes a pixel circuit positioned on the entire surface of the substrate 100 as described above, and the pixel circuit includes a transistor TT formed on the entire surface of the substrate 100.

A light-emitting diode 400 may be positioned on the pixel circuit of each of the pixels PX1, PX2, PX3. Each light-emitting diode 400 may emit first color light, which may be blue light, and may be in the form of a semiconductor chip.

A protective layer 230 may be positioned on the light-emitting diode 400. The protective layer 230 may include an inorganic material and/or an organic material, such as silicon oxide or silicon nitride.

The first color conversion layers 250R and 250G and the first transmission layer 250B may be positioned on the protective layer 230.

The first transmission layer 250B may pass incident light. That is, the first transmission layer 250B may transmit the first color light of the light-emitting diode 400. The first transmission layer 250B may include a polymer material that transmits the first color light. The first transmission layer 250B does not include a separate semiconductor nanocrystal, and may pass incident first color light as it is.

The first color conversion layers 250R and 250G may include different semiconductor nanocrystals. For example, the first color light incident to the first color conversion layer 250R may be converted into second color light by semiconductor nanocrystals included in the first color conversion layer 250R and then emitted. The first color light incident to the first color conversion layer 250G may be converted into third color light by semiconductor nanocrystals included in the first color conversion layer 250R and then emitted.

The semiconductor nanocrystals may include at least one of phosphor and/or a quantum dot material that converts incident first color light into second color light or third color light.

For example, the first color conversion layer 250R may include second color light quantum dots 3R, and the first color conversion layer 250G may include third color light quantum dots 3G.

A barrier rib 240 may be positioned between the adjacent first color conversion layers 250R, 250G and the first transmission layer 250B.

An overcoat layer 260 may be positioned on the first color conversion layers 250R, 250G and the first transmission layer 250B. The overcoat layer 260 may be omitted in one or more other embodiments.

An insulating layer 270 may be positioned on the overcoat layer 260 and the barrier rib 240, and the second color conversion layers 290R and 290G and the second transmission layer 290B may be positioned on the insulating layer 270.

The second color conversion layers 290R and 290G and the second transmission layer 290B may have the same configuration as the first color conversion layers 250R and 250G and the first transmission layer 250B, respectively.

A barrier rib 280 may be positioned between respective adjacent ones of second color conversion layers 290R and 290G and the second transmission layer 290B.

Depending on embodiments, layers including the insulating layer 270, the second color conversion layers 290R and 290G, the second transmission layer 290B, and the barrier rib 280 may be omitted.

A plurality of color filters 310R, 310G, and 310B and a light-blocking member 320 may be positioned on the second color conversion layers 290R and 290G and the second transmission layer 290B. The color filter 310R may emit second color light, the color filter 310G may emit third color light, and the color filter 310B may emit first color light.

A substrate 330 may be positioned on the plurality of color filters 310R, 310G, and 310B and the light-blocking member 320.

Although the embodiments of the present disclosure have been described in detail above, the scope of the present disclosure is not limited thereto, and various modifications and improvements of a person of an ordinary skill in the art using the basic concept of the present disclosure defined in the following claims are also included in the scope of the present disclosure, with functional equivalents of the claims to be included therein.

DESCRIPTION OF SOME OF THE REFERENCE CHARACTERS

| | |
|---|---|
| 50, 51, 52, 55, 95: opening | 53, 53a, 56, 56a: inspection opening |
| 60a, 60b: adhesive layer | 75, 76: connection wire |
| 80: alignment key | 100, 330: substrate |
| 110: lower pattern | 120: buffer layer |
| 130: active pattern | 131, 133: conduction region |
| 132: channel region | |
| 141, 142, 143, 144, 145, 146, 147, 148, 149, 150, 151, 152, 153, 154, 270: insulating layer | |
| 160a, 160b, 170d, 170e, 171b, 171c 171d, 171e, 175d, 175e, 176f, 176g: conductive layer | |
| 161a: gate electrode | 170: anode pad |
| 171: cathode pad | 170a, 170b, 170c, 171a, 171: connection member |
| 175: front data pad | 176: rear data pad |
| 200: side wire | 201, 201a, 202, 202a: residue |
| 230: protective layer | 240, 280: barrier rib |
| 250B, 290B: transmission layer | 250R, 250G, 290R, 290G: color conversion layer |
| 301: anode | 302: cathode |
| 310R, 310G, 310B: color filter | 320: light-blocking member |
| 400: light-emitting diode | 500: driving circuit unit |
| 700: intaglio plate | 800: printing pad |
| 900: passivation layer | |
| 1000a, 1000b, 1000c, and 1000d, 1003: display device | |
| 1001, 1002: tiled display device | |

What is claimed is:

1. A display device comprising:

a substrate having opposite first and second surfaces, and comprising a display area, and a peripheral area around the display area in plan view;

transistors above the first surface of the substrate;

data lines above the first surface of the substrate, and electrically connected to the transistors;

light-emitting diodes above the first surface of the substrate;

front data pads above the first surface of the substrate, electrically connected to the data lines, and arranged in a first direction along a first side of the substrate;

a first insulating layer above the front data pads;

rear data pads under the second surface of the substrate, and arranged in the first direction;

a second insulating layer under the rear data pads, and defining a first opening and a second opening overlapping one of the rear data pads, a first virtual line extending from the first opening in the first direction not overlapping the second opening; and a first side wire electrically connecting a first front data pad of the front data pads to a first rear data pad of the rear data pads, and electrically connected to and overlapping the first rear data pad through the first opening.

2. The display device of claim 1, wherein a first horizontal side of the first opening, which extends in the first direction and is closer to the display area than a second horizontal side of the first opening, is closer to the first side of the substrate than a third horizontal side of the second opening, which extends in the first direction and is farther from the display area than a fourth horizontal side of the second opening.

3. The display device of claim 1, wherein the first opening corresponds to a first side of the first rear data pad with respect to the first direction, and wherein the second opening corresponds to a second side of the first rear data pad that is opposite to the first side of the first rear data pad.

4. The display device of claim 1, wherein a second virtual line extending from the first opening in a second direction crossing the first direction does not overlap the second opening.

5. The display device of claim 1, wherein the first opening is at a first corner of the one of the rear data pads, and wherein the second opening is at a second corner of the one of the rear data pads that is diagonal to the first corner.

6. The display device of claim 1, further comprising a second side wire that electrically connects a second front data pad of the front data pads to a second rear data pad of the rear data pads, wherein the second insulating layer defines a third opening and a fourth opening overlapping the second rear data pad, wherein the second side wire is electrically connected to and overlaps the second rear data pad through the third opening, and wherein a third virtual line extending from the third opening in the first direction does not overlap the fourth opening.

7. The display device of claim 6, further comprising a residue connected to the second side wire, comprising a same material as the second side wire, and at a same layer.

8. The display device of claim 7, wherein a width of the residue in a second direction crossing the first direction is less than or equal to a width of the second side wire in the second direction.

9. The display device of claim 8, wherein the residue protrudes toward the first rear data pad that is adjacent to the second rear data pad.

10. The display device of claim 9, wherein the residue overlaps the first rear data pad, and does not overlap the second opening.

11. The display device of claim 1, further comprising an anode pad and a cathode pad at a same layer as the front data pads, above the first surface of the substrate at the display area, and electrically connected to one of the light-emitting diodes.

12. The display device of claim 11, wherein the first insulating layer defines a fifth opening overlapping the anode pad, and a sixth opening overlapping the cathode pad.

13. The display device of claim 1, further comprising a printed circuit board comprising a driving circuit under the second surface of the substrate.

14. A display device comprising:

a substrate having opposite first and second surfaces, and comprising a display area, and a peripheral area around the display area in plan view;

transistors above the first surface of the substrate;

data lines above the first surface of the substrate, and electrically connected to the transistors;

light-emitting diodes above the first surface of the substrate;

a front data pad above the first surface of the substrate, electrically connected to the data lines, and arranged in a first direction along a first side of the substrate;

a first insulating layer on the front data pad;

a rear data pad under the second surface of the substrate, and arranged in the first direction;

a second insulating layer under the rear data pads, and defining a first opening and a second opening overlapping the rear data pads; and a side wire electrically connecting the front data pad and the rear data pad, electrically connected to and overlapping the rear data pad through the first opening, and comprising a residue at a same layer as, and comprising a same material as, the side wire.

15. The display device of claim 14, wherein a width of the residue in a second direction crossing the first direction is less than or equal to a width of the side wire in the second direction.

16. The display device of claim 15, wherein the residue protrudes toward another rear data pad adjacent to the side wire.

17. The display device of claim 16, wherein the residue does not overlap the other rear data pad.

18. A tiled display device, comprising:

display devices;

an adhesive layer between adjacent ones of the display devices; and a driving circuit unit on a rear surface of at least one of the display devices, wherein the display devices comprise:

a substrate having opposite first and second surfaces, and comprising a display area, and a peripheral area around the display area in plan view; and transistors above the first surface of the substrate;

data lines above the first surface of the substrate, and electrically connected to the transistors;

light-emitting diodes above the first surface of the substrate;

front data pads above the first surface of the substrate, electrically connected to the data lines, and arranged in a first direction along a first side of the substrate;

a first insulating layer above the front data pads;

rear data pads under the second surface of the substrate, and arranged in the first direction;

a second insulating layer under the rear data pads, and defining a first opening and a second opening overlapping one of the rear data pads, a virtual line extending in the first direction from the first opening not overlapping the second opening; and a first side wire electrically connecting a first front data pad of the front data pads to a first rear data pad of the rear data pads, and electrically connected to and overlapping the first rear data pad through the first opening.

19. The tiled display device of claim 18, wherein a first horizontal side of the first opening extending in the first direction, which is closer to the display area than second horizontal side of the first opening extending in the first direction, is closer to the first side of the substrate than a third horizontal side of the second opening that is farther from the display area than the first horizontal side.

* * * * *